(12) United States Patent
Li et al.

(10) Patent No.: US 12,364,024 B2
(45) Date of Patent: *Jul. 15, 2025

(54) SOLAR CELL, METHOD FOR PREPARING SAME AND SOLAR CELL MODULE

(71) Applicants: SHANGHAI JINKO GREEN ENERGY ENTERPRISE MANAGEMENT CO., LTD., Shanghai (CN); ZHEJIANG JINKO SOLAR CO., LTD., Zhejiang (CN)

(72) Inventors: Wenqi Li, Zhejiang (CN); Peiting Zheng, Zhejiang (CN); Jie Yang, Zhejiang (CN); Menglei Xu, Zhejiang (CN); Xinyu Zhang, Zhejiang (CN); Hao Jin, Zhejiang (CN)

(73) Assignees: SHANGHAI JINKO GREEN ENERGY ENTERPRISE MANAGEMENT CO., LTD., Shanghai (CN); ZHEJIANG JINKO SOLAR CO., LTD., Haining (CN)

( * ) Notice: Subject to any disclaimer, the term of this patent is extended or adjusted under 35 U.S.C. 154(b) by 119 days.

This patent is subject to a terminal disclaimer.

(21) Appl. No.: 18/448,847

(22) Filed: Aug. 11, 2023

(65) Prior Publication Data
US 2023/0420589 A1 Dec. 28, 2023

Related U.S. Application Data

(63) Continuation of application No. 17/504,498, filed on Oct. 18, 2021, now Pat. No. 11,784,266.

(30) Foreign Application Priority Data

Sep. 10, 2021 (CN) .......................... 202111064317.8

(51) Int. Cl.
*H10F 19/80* (2025.01)
*H10F 71/00* (2025.01)
(Continued)

(52) U.S. Cl.
CPC ........... *H10F 19/80* (2025.01); *H10F 71/128* (2025.01); *H10F 71/129* (2025.01); *H10F 77/311* (2025.01); *H10F 77/707* (2025.01)

(58) Field of Classification Search
None
See application file for complete search history.

(56) References Cited

U.S. PATENT DOCUMENTS

| 10,991,838 B1 | 4/2021 | Yang et al. |
| 2011/0100424 A1* | 5/2011 | Roche ............... G02B 1/115 |
| | | 136/246 |

(Continued)

FOREIGN PATENT DOCUMENTS

| CN | 102403369 A | 4/2012 |
| CN | 104393059 A | 3/2015 |

(Continued)

OTHER PUBLICATIONS

English machine translation of Chen (CN-106876490A) provided by the EPO website, All Pages, 2023. (Year: 2023).*

(Continued)

*Primary Examiner* — Daniel P Malley, Jr.
(74) *Attorney, Agent, or Firm* — USCH Law, PC

(57) ABSTRACT

A solar cell includes a substrate having a front surface and a back surface opposite to the front surface; a first passivation layer, a second passivation layer and a third passivation layer sequentially formed on the front surface of the substrate and in a direction away from the substrate; where the first passivation layer includes a dielectric material; the second passivation layer includes a first $Si_uN_v$ material, and (Continued)

a value of v/u is $1.3 \leq v/u \leq 1.7$; and the third passivation layer includes a $Si_rO_s$ material, and a value of s/r is $1.9 \leq s/r \leq 3.2$; and a tunneling oxide layer and a doped conductive layer sequentially formed on the back surface of the substrate and in a direction away from the back surface; the doped conductive layer and the substrate are doped to have a same conductivity type.

18 Claims, 7 Drawing Sheets

(51) Int. Cl.
  *H10F 77/30* (2025.01)
  *H10F 77/70* (2025.01)

(56) References Cited

U.S. PATENT DOCUMENTS

| | | | |
|---|---|---|---|
| 2012/0024378 A1* | 2/2012 | Lee | H10F 77/315 136/259 |
| 2014/0299187 A1 | 10/2014 | Chang et al. | |
| 2015/0214889 A1* | 7/2015 | Nam | H02S 30/10 136/251 |
| 2020/0343391 A1 | 10/2020 | Choi et al. | |
| 2021/0217907 A1 | 7/2021 | Chen et al. | |

FOREIGN PATENT DOCUMENTS

| | | | |
|---|---|---|---|
| CN | 106876490 A | * | 6/2017 |
| CN | 108441837 A | | 8/2018 |
| CN | 110061072 A | | 7/2019 |
| CN | 110112243 A | | 8/2019 |
| CN | 110739367 A | | 1/2020 |
| CN | 210200741 U | | 3/2020 |
| CN | 210778613 U | | 6/2020 |
| CN | 111599898 A | * | 8/2020 |
| CN | 111916523 A | | 11/2020 |
| CN | 111952414 A | | 11/2020 |
| CN | 112768534 A | | 12/2020 |
| CN | 112259615 A | | 1/2021 |
| CN | 112331742 A | | 2/2021 |
| CN | 212625596 U | | 2/2021 |
| CN | 112531035 A | | 3/2021 |
| CN | 109786476 B | | 5/2021 |
| CN | 113097346 A | | 7/2021 |
| JP | H05129277 A | | 5/1993 |
| JP | H07235684 A | | 9/1995 |
| JP | 2005277181 A | | 10/2005 |
| JP | 2009021358 A | | 1/2009 |
| JP | 5019397 B2 | | 9/2012 |
| JP | 2013197587 A | | 9/2013 |
| JP | 2013540090 A | | 10/2013 |
| JP | 2014204128 A | | 10/2014 |
| JP | 2015122435 A | | 7/2015 |
| JP | 2016127294 A | | 7/2016 |
| JP | 2017028238 A | | 2/2017 |
| JP | 6220483 B1 | | 10/2017 |
| JP | 2019129274 A | | 8/2019 |
| JP | 2020077851 A | | 5/2020 |
| JP | 2020520560 A | | 7/2020 |
| JP | 6793274 B1 | | 12/2020 |
| JP | 6854960 B1 | | 4/2021 |
| JP | 6916972 B1 | | 8/2021 |
| WO | 2017158691 A1 | | 9/2017 |

OTHER PUBLICATIONS

English machine translation of Chang (CN-111599898-A) provided by the EPO website, All Pages, 2023. (Year: 2023).*

Shanghai Jinko Green Energy Enterprise Management Co., Ltd., et al., Extended European search report, EP 21202789.0, Mar. 3, 2022, 85 pgs.

Shanghai Jinko Green Energy Enterprise Management Co., Ltd et al., AU First Office Action, AU 2021250916, Oct. 10, 2022, 8 pgs.

Shanghai Jinko Green Energy Enterprise Management Co., Ltd et al., JP First Office Action with English translation, JP2021-171256, Nov. 29, 2021, 13 pgs.

Shanghai Jinko Green Energy Enterprise Management Co., Ltd et al., JP Third Office Action with English translation, JP2021-171256, Jun. 21, 2022, 14 pgs.

Shanghai Jinko Green Energy Enterprise Management Co., Ltd et al., US Non-Final-Rejection, U.S. Appl. No. 17/504,498, Apr. 25, 2023, 14 pgs.

Shanghai Jinko Green Energy Enterprise Management Co., Ltd., et al., AU First Office Action, AU 2022291584, Nov. 6, 2023, 6 pgs.

* cited by examiner

SOLAR CELL, METHOD FOR PREPARING SAME AND SOLAR CELL MODULE

CROSS-REFERENCE TO RELATED APPLICATION

The application is a continuation of U.S. patent application Ser. No. 17/504,498, filed on Oct. 18, 2021, which claims priority to Chinese Patent Application No. 202111064317.8, filed on Sep. 10, 2021, the content of each of which is incorporated herein by reference in its entirety.

TECHNICAL FIELD

Embodiments of the present disclosure relate to a photovoltaic technology, in particular to a solar cell, a method for preparing a solar cell and a solar cell module.

BACKGROUND

A solar cell can be used widely due to a good photoelectric conversion capacity. The solar cell generally has a passivation structure on a surface of the solar cell in order to inhibit a recombination of carriers on the surface. The passivation structure on the surface of the solar cell has a relatively high refractive index and relatively good passivation effect, so that as much incident light as possible can be absorbed by the solar cell, and a carrier concentration of the solar cell can be increased.

However, the existing solar cell with the passivation layer still has relatively high reflectivity for the incident light, so that the existing solar cell has a relatively low open circuit voltage, a low short-circuit current and a low filling factor, resulting in a relatively low photoelectric conversion rate of the solar cell.

SUMMARY

As one aspect, some embodiments of the present disclosure provide a solar cell, including: a substrate having a front surface and a back surface opposite to the front surface; a first passivation layer, a second passivation layer and a third passivation layer sequentially formed on the front surface of the substrate and in a direction away from the substrate; the first passivation layer includes a dielectric material; the second passivation layer includes a first $Si_uN_v$ material, and a value of v/u is in a range of 1.3 to 1.7; and the third passivation layer includes a $Si_rO_s$ material, and a value of s/r is in a range of 1.9 to 3.2; and a tunneling oxide layer and a doped conductive layer sequentially formed on the back surface of the substrate and in a direction away from the back surface, the doped conductive layer and the substrate are doped to have a same conductivity type.

In some examples, a refractive index of the third passivation layer is smaller than a refractive index of the second passivation layer.

In some examples, the third passivation layer has a refractive index in a range of 1.4 to 1.6, and the second passivation layer has a refractive index in a range of 1.8 to 2.

In some examples, the third passivation layer includes a first silicon oxide sub-layer and a second silicon oxide sub-layer stacked in the direction away from the substrate, the value of s/r of the $Si_rO_s$ material of the first silicon oxide sub-layer is in a range of 1.9 to 2.2; the value of s/r of the $Si_rO_s$ material of the second silicon oxide sub-layer is in a range of 2.2 to 3.2, and a refractive index of the first silicon oxide sub-layer is greater than a refractive index of the second silicon oxide sub-layer.

In some examples, the dielectric material includes at least one of aluminum oxide, titanium oxide, gallium oxide and hafnium oxide.

In some examples, the dielectric material is an $Al_xO_y$ material, and a value of y/x is in a range of 1.4 to 1.6.

In some examples, the third passivation layer has a thickness in a range of 60 nm to 90 nm in a direction perpendicular to the front surface.

In some examples, the second passivation layer has a thickness in a range of 35 nm to 55 nm in a direction perpendicular to the front surface.

In some examples, the first passivation layer has a thickness in a range of 2 nm to 8 nm in a direction perpendicular to the front surface.

In some examples, the first passivation layer has a refractive index in a range of 1.6 to 1.8.

In some examples, the solar cell further includes: a fourth passivation layer formed on a side of the doped conductive layer facing away from the substrate; the fourth passivation layer includes a second $Si_mN_n$ material, and a value of n/m is in a range of 1.2 to 1.6.

In some examples, the fourth passivation layer has a refractive index in a range of 1.9 to 2.1, and the fourth passivation layer has a thickness in a range of 80 nm to 100 nm in a direction perpendicular to the back surface.

In some examples, the substrate is an N-type semiconductor substrate; the doped conductive layer is at least one of an N-type doped polycrystalline silicon layer, an N-type doped microcrystalline silicon layer and an N-type doped amorphous silicon layer.

As a second aspect, some embodiments of the present disclosure further provide a solar cell module, including: at least one cell string formed by connecting a plurality of the above solar cells; a packaging layer configured to cover a surface of the at least one cell string; and a cover plate configured to cover a surface of the packaging layer away from the at least one cell string.

As a third aspect, some embodiments of the present disclosure further provide a method for preparing a solar cell, including: providing a substrate having a front surface and a back surface opposite to the front surface; forming a tunneling oxide layer and a doped conductive layer sequentially on the back surface of the substrate in a direction away from the back surface, the doped conductive layer and the substrate are doped to have a same conductivity type; and forming a first passivation layer, a second passivation layer and a third passivation layer sequentially on the front surface of the substrate and in a direction away from the substrate; the first passivation layer includes a dielectric material; the second passivation layer includes a first $Si_uN_v$ material, and a value of v/u is in a range of 1.3 to 1.7; and the third passivation layer includes a $Si_rO_s$ material, and a value of s/r is in a range of 1.9 to 3.2.

In some examples, the forming the third passivation layer is performed by a plasma-enhanced chemical vapor deposition process, and includes: introducing silane and nitrous oxide into a reaction chamber; and ionizing the silane and the nitrous oxide; a pulse power per unit area is in a range of 140 mW/cm² to 170 mW/cm², a pressure of the reaction chamber is in a range of 1600 mTorr to 2000 mTorr, a flow ratio of the silane to the nitrous oxide is in a range of 1:15 to 1:20; and a reaction time is in a range of 3 s to 22 s.

In some examples, the forming the second passivation layer is performed by a plasma-enhanced chemical vapor deposition process, and includes: introducing silane and ammonia gas into a reaction chamber; and ionizing the silane and the ammonia gas; a pulse power per unit area is in a range of 140 mW/cm² to 180 mW/cm²; a pressure of the reaction chamber is in a range of 1600 mTorr to 2000 mTorr; a flow ratio of the silane to the ammonia gas is in a range of 1:3 to 1:16; and a reaction time is in a range of 3 s to 31 s.

In some examples, the forming the first passivation layer is performed by an atomic layer deposition process, and includes: introducing trimethyl aluminum and water into a reaction chamber, a ratio of the trimethyl aluminum to the water is in a range of 1:2 to 1:3, and a temperature is in a range of 200° C. to 300° C.

In some examples, after the first passivation layer is formed, the method further includes: performing an annealing process on the first passivation layer in a nitrogen atmosphere, an annealing temperature is in a range of 450° C. to 550° C., and an annealing duration is in a range of 10 min to 13 min.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated.

DETAILED DESCRIPTION

It can be known from the background technology that there exists a problem that a reflectivity of a solar cell to incident light is relatively high.

It is found that one reason for the relatively high reflectivity of the solar cell to the incident light may be that: a silicon nitride material is generally used for a passivation layer on a surface of the solar cell; the silicon nitride material has a good passivation effect, but a relatively high refractive index, which results in certain light absorption loss. That is, a silicon nitride passivation layer may have a relatively low anti-reflectivity, resulting in a relatively weak light absorption capacity of the solar cell to the incident light.

Some embodiments of the present disclosure provide a solar cell, including: a first passivation layer, a second passivation layer and a third passivation layer sequentially formed on a front surface of a substrate and in a direction away from the substrate. The first passivation layer includes a dielectric material. The second passivation layer includes a first $Si_uN_v$ material, and a value of v/u is $1.3 \leq v/u \leq 1.7$. The second passivation layer has a relatively high refractive index by adjusting an atomic ratio in the first $Si_uN_v$ material, so that the second passivation layer has relatively strong light absorption capacity for long-wave light (e.g., an infrared light or near infrared light). The third passivation layer includes a $Si_rO_s$ material, and a value of s/r is $1.9 \leq s/r \leq 3.2$. The $Si_rO_s$ material has relatively strong light absorption capacity for short-wave light by adjusting an atomic ratio in the $Si_rO_s$ material. In this way, the third passivation layer having relatively strong light absorption capacity for short-wave light, together with the second passivation layer having relatively strong light absorption capacity for short-wave light, allows the whole solar cell have relatively strong light absorption capacity for incident light, and thus the solar cell surface can have a relatively large anti-reflectivity. Further, the first $Si_uN_v$ material and the $Si_rO_s$ material have a good passivation effect, thereby improving an open-circuit voltage, a short-circuit current and a filling factor of the solar cell and increasing a photoelectric conversion rate of the solar cell.

Embodiments of the present disclosure will be described in detail below with reference to the accompanying drawings. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
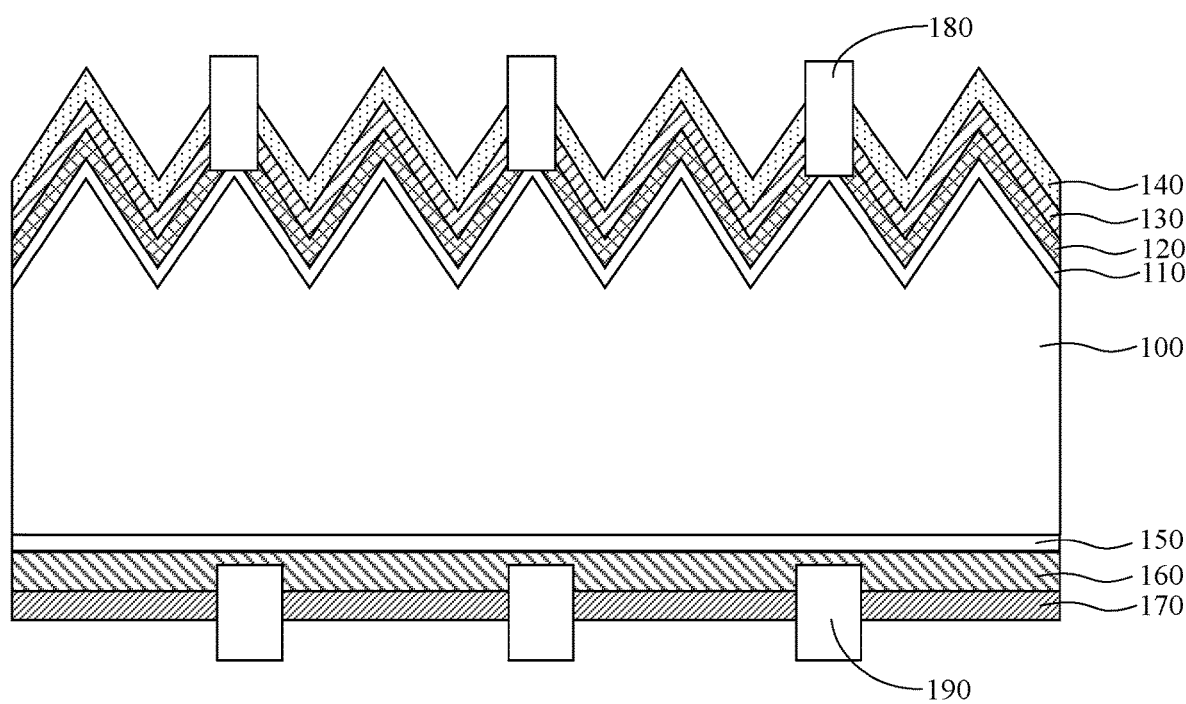
FIG. 1 shows a schematic structural diagram of a solar cell according to some embodiments of the present disclosure.

FIG. 1 shows a schematic structural diagram of a solar cell according to some embodiments of the present disclosure.

As shown in FIG. 1, the solar cell includes: a substrate 100 having a front surface and a back surface opposite to the front surface; a first passivation layer 120, a second passivation layer 130 and a third passivation layer 140 sequentially formed on the front surface of the substrate 100 and in a direction away from the substrate 100; and a tunneling oxide layer 150 and a doped conductive layer 160 sequentially formed on the back surface of the substrate 100 and in a direction away from the back surface. The first passivation layer 120 includes a dielectric material. The second passivation layer 130 includes a first $Si_uN_v$ material, and a value of v/u is $1.3 \leq v/u \leq 1.7$. The third passivation layer 140 includes a $Si_rO_s$ material, and a value of s/r is $1.9 \leq s/r \leq 3.2$. The doped conductive layer 160 and the substrate 100 are doped to have a same conductivity type.

The substrate 100 is used to receive incident light and generate photo-generated carriers. In some examples, the substrate 100 may be a silicon substrate 100, and the material of the silicon substrate 100 may include at least one of monocrystalline silicon, polycrystalline silicon, amorphous silicon and microcrystalline silicon. In some examples, the material of the substrate 100 may be a carbon simple substance, an organic material or a multi-component compound, and the multi-component compound includes gallium arsenide, cadmium telluride, copper indium selenium, etc. In some examples, the solar cell is configured as a tunnel oxide passivated contact (TOPCON) solar cell. In some embodiments, the front surface and/or back surface of the substrate 100 can be used to receive the incident light. Generally, the front surface of the solar call may be designated as a main light-receiving surface that faces a light source (e.g., the sun). In some examples, the front surface of the substrate 100 may be set as a pyramid textured surface, so that the front surface of the substrate 100 can have a relatively small reflectivity to the incident light, as well as a relatively large light absorption and utilization rate. The back surface of the substrate 100 may be set as a non-pyramid textured surface, such as a stacked and stepped morphology, to ensure that the tunneling oxide layer 150 on the back surface has relatively high density and uniformity, and accordingly the tunneling oxide layer 150 can have a good passivation effect on the back surface of the substrate 100.

In some examples, the substrate 100 is an N-type semiconductor substrate 100, that is, the substrate 100 is doped with N-type dopants (or doping elements), and the N-type dopants may include at least one of phosphorus, arsenic or antimony. The front surface of the substrate 100 is provided with an emitter 110. The emitter 110 may be a P-type doped layer doped with P-type dopants. The substrate 100 and the emitter 110 form a PN junction. In some examples, the emitter 110 may be formed by doping and diffusing P-type dopants at a surface layer of the substrate 100, and a doped part of the substrate 100 severs as the emitter 110. In some examples, the P-type dopants may be boron.

For the $Si_rO_s$ material of the third passivation layer 140, a value of s/r is $1.9 \leq s/r \leq 3.2$, where s represents the number of oxygen atoms (i.e., O atoms) and r represents the number of silicon atoms (i.e., Si atoms). By adjusting the atomic ratio of the O atoms to the Si atoms in the $Si_rO_s$ material, a refractive index of the $Si_rO_s$ material may be adjusted. In this way, the refractive index of the third passivation layer 140 is adjusted to match a refractive index of the second passivation layer 130, so that light reflection loss caused by poor refractive index matching between the third passivation layer 140 and the second passivation layer 130 can be reduced. On the other hand, a thickness of the third passivation layer 140 is adjusted to match with a wavelength of the incident light and the refractive index. The thickness of the passivation layer, the refractive index of the passivation layer and the wavelength of the incident light shall satisfy a following formula: a wavelength of incident light=4×thickness×refractive index. In this way, the passivation layer can have better light transmission capacity, relatively strong light absorption capacity for the incident light, as well as better passivation effect. In some examples, the wavelength of the incident light may be set to 632 nm.

In addition, by adjusting the atomic ratio of the O atoms to the Si atoms in the $Si_rO_s$ material, the third passivation layer 140 has relatively strong light absorption capacity for short-wave light. The third passivation layer 140, together with the second passivation layer 130 having the relatively strong light absorption capacity for long-wave light, allows the whole solar cell to have relatively strong light absorption capacity for the incident light (including short-wave light and long-wave light). In this way, a carrier concentration of the front surface of the substrate 100 of the solar cell can be increased, thus increasing an open-circuit voltage, a short-circuit current, and a filling factor of the solar cell, and improving the photoelectric conversion rate of the solar cell.

It is worth noting that the existing solar cells are generally blue, due to that the reflectivity of the passivation layer to the short-wave light is relatively high in the existing solar cells. However, in the present embodiments, since the third passivation layer 140 has relatively strong light absorption capacity for the short-wave light, a solar cell module including the solar cells may be grayish blue or even black, which is beneficial for preparing dark-colored solar cell modules.

In some examples, the refractive index of the third passivation layer 140 is lower than the refractive index of the second passivation layer 130. This may be achieved by adjusting the atomic ratio of the O atoms to the Si atoms in the $Si_rO_s$ material of the third passivation layer 140. In this case, the third passivation layer 140 is an optically thinner medium, and the second passivation layer 130 is an optically denser medium. In a case that the incident light enters the optically denser medium from the optically thinner medium, an angle between the incident light and a normal line of the optically denser medium is relatively small because the refractive index of the optically denser medium is relatively large, so that the incident light may enter the substrate 100 at an angle close to vertical incidence. In this way, more light may enter the substrate 100, and the reflectivity of the solar cell to the incident light may be relatively small. It is worth noting that although a refractive index of the $Si_rO_s$ material in the third passivation layer 140 is lower than a refractive index of the first $Si_uN_v$ material in the second passivation layer 130 intrinsically, the refractive index of the $Si_rO_s$ material may be further decreased as compared with the refractive index of the first $Si_uN_v$ material, by further adjusting the atomic ratio of the O atoms to the Si atoms in $Si_rO_s$ material. As such, the incident light may enter the second passivation layer 130 from the third passivation layer 140 at a more vertical angle, thereby further reducing the reflectivity of the solar cell to the incident light, increasing the carrier concentration on the front surface of the substrate 100 and improving the photoelectric conversion rate of the solar cell.

In some examples, the refractive index of the third passivation layer 140 is 1.4~1.6. Within this range, the refractive index of the $Si_rO_s$ material is smaller than the refractive index of the first $Si_uN_v$ material, and thus the refractive index of the third passivation layer 140 is smaller than the refractive index of the second passivation layer 130, thereby the solar cell can have relatively high light absorption and utilization rate for the incident light. Moreover, since the refractive index of the third passivation layer 140 is 1.4~1.6, the problem that the refractive index of the $Si_rO_s$ material being too small may be avoided, so that the third passivation layer 140 can have a relatively strong anti-reflection effect on the incident light, and further improve the utilization rate of the incident light.

It can be understood that when the wavelength of the incident light and the refractive index of the third passivation layer 140 are provided, the thickness of the third passivation layer 140 may be determined according to the incident light and the refractive index, by adjusting the atomic ratio of the O atoms to the Si atoms in the $Si_rO_s$ material, so as to achieve better passivation effect and light transmission capacity of the solar cell. In addition, the thickness of the third passivation layer 140 is enabled to match the thickness of the second passivation layer 130, so that the front surface of the substrate 100 of the solar cell can have a relatively good overall passivation effect.

In some examples, the third passivation layer 140 has a thickness of 60 nm~90 nm in a direction perpendicular to the front surface. In this way, the third passivation layer 140 has good light transmission capacity and is capable for absorbing more short-wave light. In addition, the third passivation layer 140 within this thickness range also has a good passivation effect, which not only allows a relatively high carrier concentration on the front surface of the substrate 100 of the solar cell, but also inhibits the recombination of carriers on the front surface of the substrate 100, thereby increasing the open-circuit voltage and short-circuit current of the solar cell and further increasing the photoelectric conversion rate of the solar cell.

In some examples, for the $Si_rO_s$ material of the third passivation layer 140, the atomic ratio of the O atoms to the Si atoms may be 1.9≤s/r≤2.2. The third passivation layer 140 may have a refractive index of 1.51~1.6, and a thickness of 60 nm~67 nm. In some examples, for the $Si_rO_s$ material of the third passivation layer 140, the atomic ratio of the O atoms to the Si atoms may be 2.2≤s/r≤2.5. The third passivation layer 140 may have a refractive index of 1.47~1.51, and a thickness of 67 nm~74 nm. In some examples, for the $Si_rO_s$ material of the third passivation layer 140, the atomic ratio of the O atoms to the Si atoms may also be 2.5≤s/r≤2.7. The third passivation layer 140 may have a refractive index of 1.45~1.47, and a thickness of 74 nm~79 nm. In some examples, for the $Si_rO_s$ material of the third passivation layer 140, the atomic ratio of the O atoms to the Si atoms may be 2.7≤s/r≤3.2. The third passivation layer 140 may have a refractive index of 1.4~1.45, and a thickness of 79 nm~90 nm.

Figure 2:
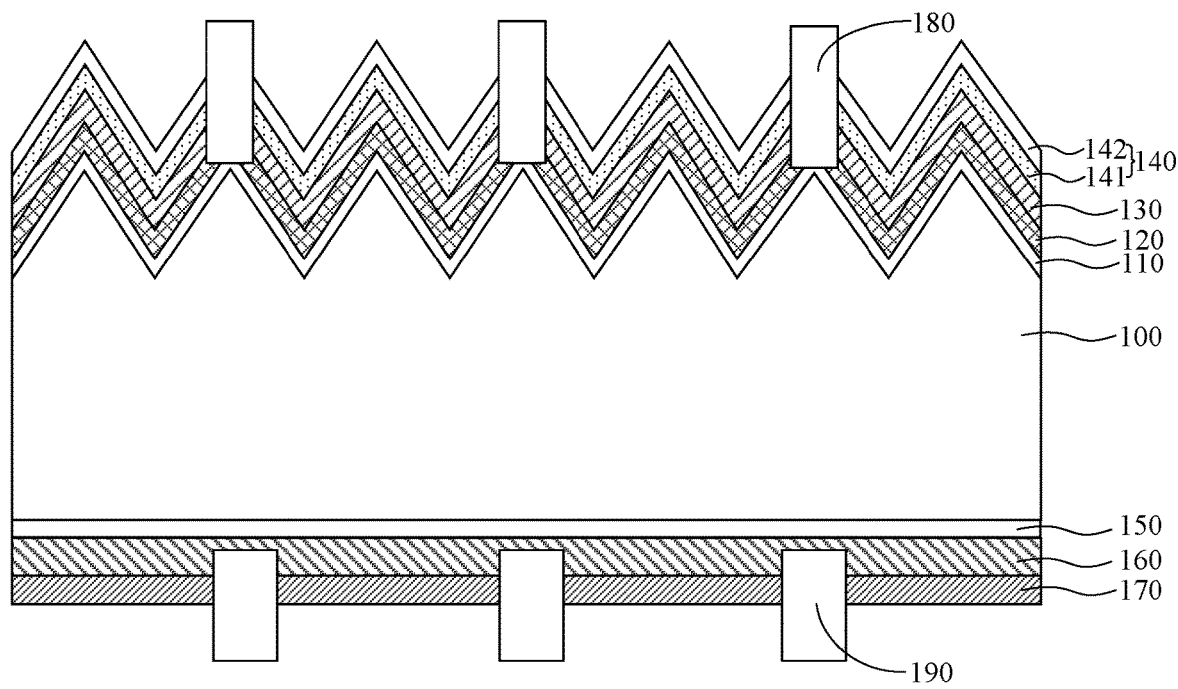
FIG. 2 shows a schematic structural diagram of another solar cell according to some embodiments of the present disclosure.

As shown in FIG. 2, in some examples, the third passivation layer 140 may have a double-layer structure, including a first silicon oxide sub-layer 141 and a second silicon oxide sub-layer 142 stacked in the direction away from the substrate 100. Both the first silicon oxide sub-layer 141 and the second silicon oxide sub-layer 142 include the $Si_rO_s$ material. Herein, the value of s/r of the $Si_rO_s$ material in the first silicon oxide sub-layer 141 is 1.9≤s/r≤2.2; the value of s/r of $Si_rO_s$ material in the second silicon oxide sub-layer 142 is 2.2≤s/r≤3.2, and a refractive index of the first silicon oxide sub-layer 141 is greater than a refractive index of the second silicon oxide sub-layer 142.

Compared with the third passivation layer 140 having a single-layer structure, in the exemplary solar cell as show in FIG. 2, the first silicon oxide sub-layer 141 and the second silicon oxide sub-layer 142 are provided, and the refractive index of the first silicon oxide sub-layer 141 is greater than the refractive index of the second silicon oxide sub-layer 142, so that reflection times and interference times of the incident light in the third passivation layer 140 may be increased, and absorption of the incident light by the third passivation layer 140 may be increased to a greater extent, thus achieving a good anti-reflection effect of the third passivation layer 140.

Both the first silicon oxide sub-layer 141 and the second silicon oxide sub-layer 142 include the $Si_rO_s$ material. The refractive indices of the first silicon oxide sub-layer 141 and the second silicon oxide sub-layer 142 are adjusted by adjusting the atomic ratio of the O atoms to the Si atoms in the $Si_rO_s$ material, so that the refractive index of the first silicon oxide sub-layer 141 is larger than the refractive index of the second silicon oxide sub-layer 142. The thickness of the first silicon oxide sub-layer 141 is set to match the refractive index of the first silicon oxide sub-layer 141, and the thickness of the second silicon oxide sub-layer 142 is set to match the refractive index of the second silicon oxide sub-layer 142; so that both the first silicon oxide sub-layer 141 and the second silicon oxide sub-layer 142 can have good passivation effect.

In some examples, the first silicon oxide sub-layer 141 may have a refractive index of 1.51~1.6, such as 1.53~1.6. Accordingly, for the $Si_rO_s$ material of the first silicon oxide sub-layer 141, the atomic ratio of the O atoms to the Si atoms may be 1.9≤s/r≤2.1, and the thickness of the first silicon oxide sub-layer 141 may be 30 nm~40 nm. The second silicon oxide sub-layer 142 may have a refractive index of 1.4~1.51, such as 1.4~1.47. Accordingly, for the $Si_rO_s$ material of the second silicon oxide sub-layer 142, the atomic ratio of the O atoms to the Si atoms may be 2.4≤s/r≤3.2, and the thickness of the second silicon oxide sub-layer 142 may be 30 nm~50 nm.

Figure 3:
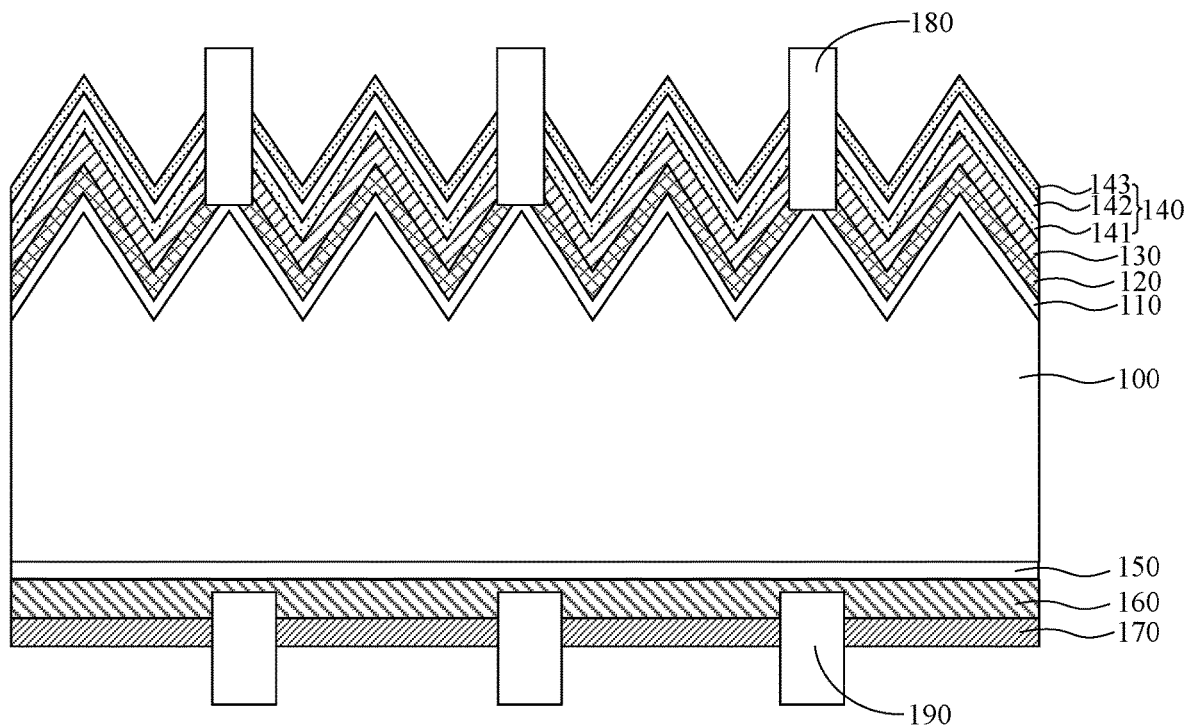
FIG. 3 shows a schematic structural diagram of yet another solar cell according to some embodiments of the present disclosure.

As shown in FIG. 3, in other examples, the third passivation layer 140 may have a three-layer structure, including a first silicon oxide sub-layer 141, a second silicon oxide sub-layer 142 and a third silicon oxide sub-layer 143 stacked in the direction away from the substrate 100. The first silicon oxide sub-layer 141, the second silicon oxide sub-layer 142 and the third silicon oxide sub-layer 143 all include the $Si_rO_s$ material. Refractive indices of the first silicon oxide sub-layer 141, the second silicon oxide sub-layer 142, and the third silicon oxide sub-layer 143 gradually decrease. In some examples, for the $Si_rO_s$ material of the first silicon oxide sub-layer 141, the atomic ratio of the O atoms to the Si atoms may be 1.9≤s/r≤2.2, such as 1.9≤s/r≤2.1. The first silicon oxide sub-layer 141 may have a refractive index of 1.51~1.6, such as 1.53~1.6, and a thickness of 10 nm~20 nm. For the $Si_rO_s$ material of the second silicon oxide sub-layer 142, the atomic ratio of the O atoms to the Si atoms may be 2.2≤s/r≤2.7, such as 2.2≤s/r≤2.5. The second silicon oxide sub-layer 142 may have a refractive index of 1.45~1.51, such as 1.46~1.51, and a thickness of 20 nm~30 nm. For the $Si_rO_s$ material of the third silicon oxide sub-layer 143, the atomic ratio of the O atoms to the Si atoms may be 2.7≤s/r≤3.2, such as 2.9≤s/r≤3.2. The third silicon oxide sub-layer 143 may have a refractive index of 1.4~1.45, such as 1.4~1.43, and a thickness of 30 nm~40 nm.

It is worth noting that the overall refractive index of the third passivation layer 140 is in the range of 1.4~1.6, regardless of whether the third passivation layer 140 is a single-layer structure or a multi-layer structure, so that the refractive index of the third passivation layer 140 matches the refractive index of the second passivation layer 130, and thus the substrate 100 can have relatively strong light absorption capacity for the incident light. It can be understood that under the condition that the overall refractive index of the third passivation layer 140 is in the range of 1.4~1.6, the overall thickness of the third passivation layer 140 is in the range of 60 nm~90 nm regardless of whether the third passivation layer 140 is the single-layer structure or the multi-layer structure.

With continued reference to FIG. 1, the first $Si_uN_v$ material of the second passivation layer 130 has a relatively high refractive index, so a Si—H bond density in the first $Si_u N_v$ material is relatively high, which makes the first $Si_u N_v$ material have a good passivation effect. However, the second passivation layer 130 may bring certain light absorption loss due to the relatively high refractive index of the first $Si_uN_v$ material, that is, the second passivation layer 130 may have poor anti-reflection capacity to the incident light. In the present embodiments, the third passivation layer 140 is provided on a side of the second passivation layer 130 away from the substrate 100, and the $Si_rO_s$ material of the third passivation layer 140 has a relatively small refractive index. As such, the relatively high refractive index of the second passivation layer 130 optically matches the relatively low refractive index of the third passivation layer 140, so as to improve the light absorption capacity of the substrate 100 to the incident light. In addition, the second passivation layer 130 mainly absorbs long-wave light, and the third passivation layer 140 mainly absorbs short-wave light, so that the solar cell can have good light absorption capacity for the incident light in different wave bands.

For the first $Si_uN_v$ material of the second passivation layer 130, a value of v/u is $1.3 \leq v/u \leq 1.7$, where the v represents the number of nitrogen atoms (i.e., N atoms) and the u represents the number of Si atoms. By adjusting the atomic ratio of the N atoms to the Si atoms, the refractive index of the second passivation layer 130 is adjusted to be greater than the refractive index of the third passivation layer 140. In this way, the incident light may be incident from the third passivation layer 140 to the second passivation layer 130 at a nearly vertical angle, so as to improve the utilization of the incident light.

In some examples, the second passivation layer 130 may have a single-layer structure, and the second passivation layer 130 may have a refractive index of 1.8~2. An optical matching performance between the refractive index of the second passivation layer 130 and the refractive index of the third passivation layer 140 is good within this refractive index range, so that the substrate 100 can have relatively strong light absorption capacity for the incident light, thereby reducing the reflectivity of the solar cell for the incident light. In addition, the refractive index of the second passivation layer 130 may not be too low within this refractive index range, so that reflected light or emitting light from the first passivation layer 120 may re-enter the substrate 100 due to the second passivation layer 130. In addition, the second passivation layer 130 within this refractive index range may have good passivation effect, and decreased interface state defects on the front surface of the substrate 100, thereby inhibiting the recombination of carriers on the front surface of the substrate 100 and improving the photoelectric conversion rate of the solar cell.

According to the wavelength of the incident light and the refractive index of the second passivation layer 130, the thickness of the second passivation layer 130 is set to match the refractive index of the second passivation layer 130, so that the second passivation layer 130 can have good light absorption capacity of incident light and good passivation effect. In addition, the thickness of the second passivation layer 130 is also set to adapt to the overall thickness of the solar cell. The overall thickness of the solar cell is prevented from being too thin, which may lead to breakage. The overall thickness of the solar cell is also prevented from being too thick, which may lead to difficulty in packaging. The thickness of the second passivation layer 130 may be adjusted by adjusting the atomic ratio of the Si atoms to the N atoms of the first $Si_uN_v$ material of the second passivation layer 130.

In some examples, the second passivation layer 130 has a thickness of 35 nm~55 nm in a direction perpendicular to the front surface. Within this thickness range, the thickness of the second passivation layer 130 is not too thin, so that the second passivation layer 130 can have a good refraction effect on the incident light, thus avoiding the problem that the incident light may be emitted through other passivation layers or emitted out of the substrate 100 before being absorbed by the substrate 100 due to the second passivation layer 130 being too thin. On the other hand, the number of positive charges in the second passivation layer 130 can achieve the hydrogen passivation effect within this thickness range, thereby further inhibiting the recombination of carriers on the front surface of the substrate 100.

In some examples, for the first $Si_uN_v$ material of the second passivation layer 130, the atomic ratio of the N atoms to the Si atoms may be $1.3 \leq v/u \leq 1.4$. The second passivation layer 130 may have a refractive index of 1.93~2, and a thickness of 35 nm~40 nm. In some examples, for the first $Si_uN_v$ material of the second passivation layer 130, the atomic ratio of the N atoms to the Si atoms may be $1.4 \leq v/u \leq 1.55$. The second passivation layer 130 may have a refractive index of 1.87~1.93, and a thickness of 40 nm~48 nm. In some examples, for the first $Si_uN_v$ material of the second passivation layer 130, the atomic ratio of the N atoms to the Si atoms is $1.55 \leq v/u \leq 1.65$. The second passivation layer 130 may have a refractive index of 1.84~1.87, and a thickness of 48 nm~53 nm. In some examples, for the first $Si_uN_v$ material of the second passivation layer 130, the atomic ratio of the N atoms to the Si atoms may be $1.65 \leq v/u \leq 1.7$. The second passivation layer 130 may have a refractive index of 1.8~1.84, and a thickness of 53 nm~55 nm.

Figure 4:
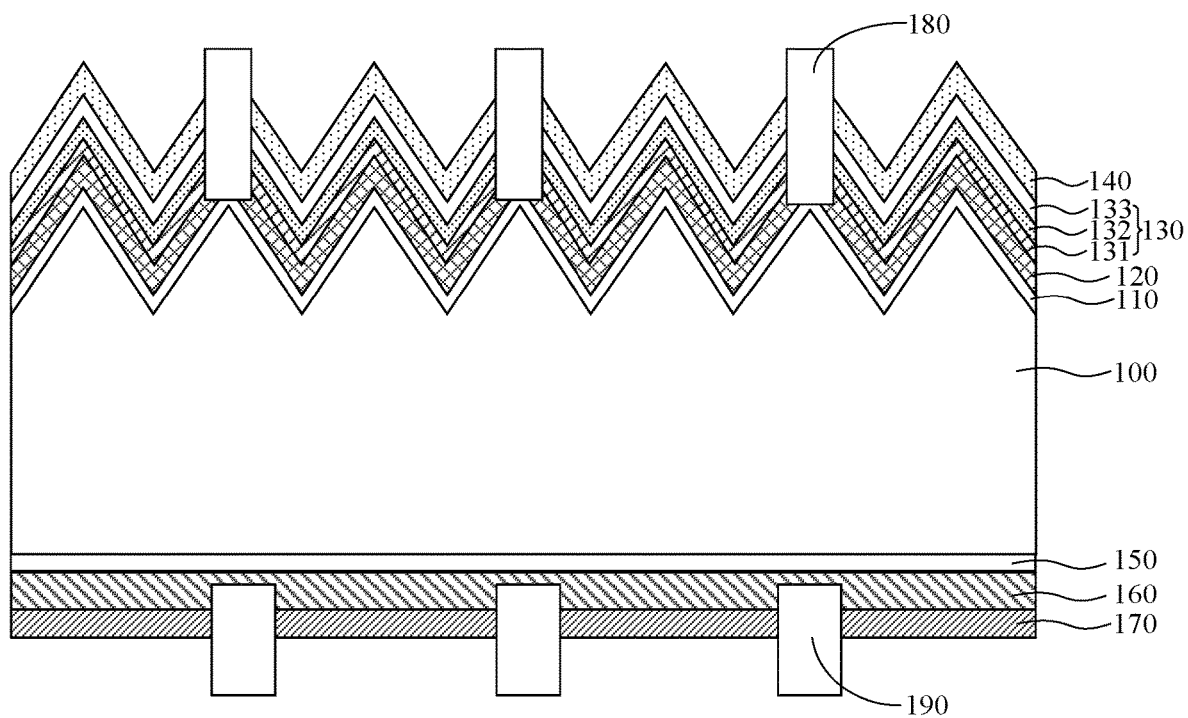
FIG. 4 shows a schematic structural diagram of still another solar cell according to some embodiments of the present disclosure.

As shown in FIG. 4, in some examples, the second passivation layer 130 may have a three-layer structure, including a first silicon nitride sub-layer 131, a second silicon nitride sub-layer 132 and a third silicon nitride sub-layer 133 stacked in the direction away from the substrate 100. The refractive indices of the first silicon nitride sub-layer 131, the second silicon nitride sub-layer 132 and the third silicon nitride sub-layer 133 gradually decrease. The first silicon nitride sub-layer 131, the second silicon nitride sub-layer 132 and the third silicon nitride sub-layer 133 all include the first $Si_uN_v$ material. In this way, long-wave photons in the long-wave light may be reflected and interfered many times in the second passivation layer 130. Compared with a single-layered silicon nitride layer, the utilization ratio of the long-wave photons can be increased to a greater extent, and the long-wave response can be improved, so that more long-wave light can be absorbed in the solar cell.

The refractive indices and thicknesses of the first silicon nitride sub-layer 131, the second silicon nitride sub-layer 132 and the third silicon nitride sub-layer 133 are adjusted by adjusting the atomic ratio of the N atoms to the Si atoms in the first $Si_uN_v$ material of the first silicon nitride sub-layer 131, the second silicon nitride sub-layer 132 and the third silicon nitride sub-layer 133 respectively. In some examples, the atomic ratio of the N atoms to the Si atoms of the first $Si_uN_v$ material of the first silicon nitride sub-layer 131 may be adjusted to be $1.3 \leq v/u \leq 1.4$. The atomic ratio of the N atoms to the Si atoms in the first $Si_uN_v$ material of the second silicon nitride sub-layer 132 may be adjusted to be $1.4 \leq v/u \leq 1.55$. The atomic ratio of the N atoms to the Si atoms of the first $Si_uN_v$ material of the third silicon nitride sub-layer 133 may be adjusted to be $1.55 \leq v/u \leq 1.7$.

Accordingly, the first silicon nitride sub-layer 131 may have a refractive index of 1.93~2 and a thickness of 8 nm~15 nm. The second silicon nitride sub-layer 132 may have a refractive index of 1.87~1.93, such as 1.88~1.9. Accordingly, for the second silicon nitride layer 132, the atomic ratio of the N atoms to the Si atoms of the first $Si_uN_v$ material may be $1.43 \leq v/u \leq 1.52$, and the thickness may be 10 nm~15 nm. The third silicon nitride sub-layer 133 may have a refractive index of 1.8~1.87, such as 1.8~1.84. Accordingly, for the third silicon nitride layer 133, the atomic ratio of the N atoms to the Si atoms of the first $Si_uN_v$ material may be $1.59 \leq v/u \leq 1.7$, and the thickness may be 17 nm~25 nm.

In some examples, the second passivation layer 130 may have a four-layer structure, including a first silicon nitride sub-layer 131, a second silicon nitride sub-layer 132, a third silicon nitride sub-layer 133 and a fourth silicon nitride sub-layer stacked in the direction away from the substrate 100. The first silicon nitride sub-layer 131, the second silicon nitride sub-layer 132, the third silicon nitride sub-layer 133 and the fourth silicon nitride sub-layer all include the first $Si_uN_v$ material. The refractive indices of the first silicon nitride sub-layer 131, the second silicon nitride sub-layer 132, the third silicon nitride sub-layer 133, and the fourth silicon nitride sub-layer gradually decrease. In some examples, for the first $Si_uN_v$ material of the first silicon nitride sub-layer 131, the atomic ratio of the N atoms to the Si atoms may be $1.3 \leq v/u \leq 1.4$, such as $1.3 \leq v/u \leq 1.36$. The first silicon nitride sub-layer 131 may have a refractive index of 1.93~2, such as 1.96~2, and a thickness of 8 nm~13 nm. For the first $Si_uN_v$ material of the second silicon nitride sub-layer 132, the atomic ratio of the N atoms to the Si atoms may be $1.4 \leq v/u \leq 1.55$, such as $1.43 \leq v/u \leq 1.52$. The second silicon nitride sub-layer 132 may have a refractive index of 1.87~1.93, such as 1.89~1.92, and a thickness of 8 nm~13 nm. For the first $Si_uN_v$ material of the third silicon nitride sub-layer 133, the atomic ratio of the N atoms to the Si atoms may be $1.55 \leq v/u \leq 1.65$, such as $1.57 \leq v/u \leq 1.63$. The third silicon nitride sub-layer 133 may have a refractive index of 1.84~1.87, such as 1.85~1.86, and a thickness of 9 nm~14 nm. For the first $Si_uN_v$ material of the fourth silicon nitride sub-layer, the atomic ratio of the N atoms to the Si atoms may be $1.65 \leq v/u \leq 1.7$, such as $1.67 \leq v/u \leq 1.7$. The fourth silicon nitride sub-layer may have a refractive index of 1.8~1.84, such as 1.8~1.83, and a thickness of 10 nm~15 nm.

It is worth noting that the refractive index of the second passivation layer 130 is in the range of 1.8~2, regardless of whether the second passivation layer 130 has the single-layer structure or the multi-layer structure. In this way, the refractive index of the second passivation layer 130 optically matches the refractive index of the third passivation layer 140, so that the reflectivity of the front surface of the substrate 100 to the incident light is relatively low, and the light absorption capacity of the substrate to the incident light is relatively strong. It can be understood that under the condition that the overall refractive index of the second passivation layer 130 is in the range of 1.8~2, the overall thickness of the second passivation layer 130 is in the range of 35 nm~55 nm regardless of whether the second passivation layer 130 has the single-layer structure or the multi-layer structure.

Figure 5:
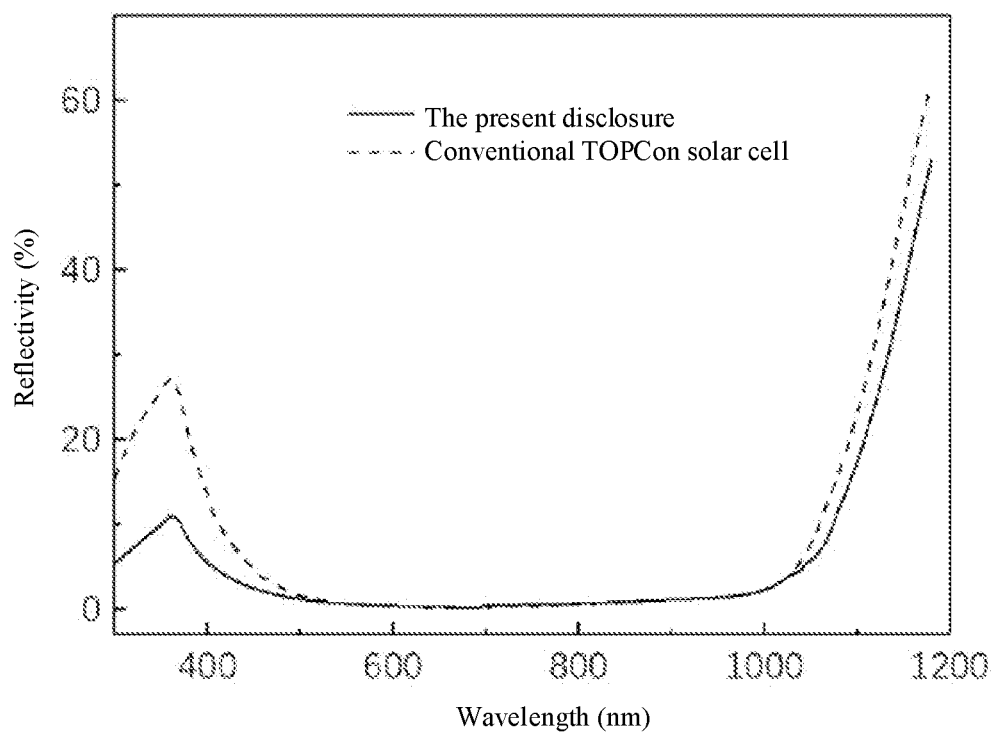
FIG. 5 shows a wavelength-reflectivity comparison diagram according to some embodiments of the present disclosure.

As shown in FIG. 5, the solar cell provided by the embodiments of the present disclosure has a lower reflectivity in the short-wave range (e.g., an ultraviolet light or near ultraviolet light) than a conventional TOPCON solar cell. The conventional TOPCON solar cell generally uses an aluminum oxide/silicon nitride stacked layer as a front passivation layer. Taking light at a wavelength of 360 nm as an example, a reflectivity of the conventional TOPCON solar cell is about 27%, and a reflectivity of the solar cell provided by the embodiments of the present disclosure is about 11.2%, which is reduced by about 58%. In addition, compared with the conventional solar cell which is blue, the solar cell provided by the embodiments of the present disclosure may be grayish blue, since the reflectivity of light is relatively low in the short-wave range, which is beneficial for preparing a dark-colored solar cell module.

The solar cell provided by the embodiments of the present disclosure also has a greatly lower average reflectivity for the light at a wavelength range of 380 nm~1050 nm. Generally, the average reflectivity of the conventional TOPCON solar cell for the light at the wavelength range of 380 nm~1050 nm is 2.2%, while the average reflectivity of the solar cell provided by the embodiments of the present disclosure is 1.3%, which is reduced by about 41%. In addition, a TOPCON solar cell including the first passivation layer 120, the second passivation layer 130, and the third passivation layer 140 in the present embodiments, has a short-circuit current increased by more than 70 mA.

As a passivation layer disposed close to the substrate 100, the first passivation layer 120 is required to have a good passivation effect. In some examples, the dielectric material of the first passivation layer 120 may include at least one of aluminum oxide, titanium oxide, gallium oxide and hafnium oxide. It is worth noting that the aluminum oxide, the titanium oxide, the gallium oxide and the hafnium oxide are field passivation materials, which have a field passivation effect on the front surface of the substrate 100. A field passivation refers to forming a built-in electric field at an interface of the substrate 100 to reduce the concentration of electrons or holes at the interface of the substrate 100, thus achieving the surface passivation effect. This built-in electric field may generally be obtained by providing fixed electrical charges at the interface of the substrate 100.

In some examples, the dielectric material may be $Al_xO_y$ material, and a value of y/x is $1.4 \leq y/x \leq 1.6$, where y represents the number of O atoms and x represents the number of aluminum atoms (i.e., Al atoms). The $Al_xO_y$ material has a good field passivation effect, because the $Al_xO_y$ material may provide a sufficient number of fixed negative electrical charges. As such, the built-in electric field may be formed at the front surface of the substrate 100, so as to reduce a minority carrier concentration at the front surface of the substrate 100 and inhibit the recombination of carriers, thereby improving the open-circuit voltage and short-circuit current of the solar cell. In addition, the $Al_xO_y$ material further has a certain chemical passivation effect, that is, the recombination rate of carriers can be suppressed by reducing the number of defects on the front surface of the substrate 100. The refractive index and thickness of the first passivation layer 120 are adjusted by adjusting the atomic ratio of the O atoms to the Al atoms, so that the refractive index and thickness of the first passivation layer 120 are optimized and the first passivation layer 120 has a good passivation effect.

In some examples, the first passivation layer 120 has a refractive index of 1.6~1.8. In this refractive index range, the refractive index of the first passivation layer 120 matches the refractive index of the second passivation layer 130, thus reducing the light reflection loss caused by poor refractive index matching between the first passivation layer 120 and the second passivation layer 130, so that the first passivation layer 120 can have good light absorption capacity for the incident light.

Under the condition that the wavelength of the incident light and the refractive index of the first passivation layer 120 are determined, a thickness of the first passivation layer 120 may be determined to enable the thickness of the first passivation layer 120 to match the refractive index, so that the first passivation layer 120 can have good passivation effect. In some examples, the first passivation layer 120 has a thickness of 2 nm~8 nm in the direction perpendicular to the front surface. In this case, the first passivation layer 120 has relatively strong electronegativity, so that a selective transmission of carriers can be realized. In addition, the thickness of the first passivation layer 120 is related to the field passivation effect. The greater the thickness of the first passivation layer 120, the better the field passivation effect of the first passivation layer 120. The thickness of the first passivation layer 120 is adjusted within this ratio range, which can not only make the first passivation layer 120 have good field passivation effect, but also avoid the problem that the substrate 100 is damaged by stress due to excessive thickness.

In some examples, for the $Al_xO_y$ material of the first passivation layer 120, the atomic ratio of the O atoms to the Al atoms may be $1.4 \leq y/x \leq 1.42$. The first passivation layer 120 may have a refractive index of 1.78~1.8, and a thickness of 2 nm~2.6 nm. In some examples, for the $Al_xO_y$ material of the first passivation layer 120, the atomic ratio of the O atoms to the Al atoms may be $1.42 \leq y/x \leq 1.48$. The first passivation layer 120 may have a refractive index of 1.72~1.78, and a thickness of 2.6 nm~4.4 nm. In some examples, for the $Al_xO_y$ material of the first passivation layer 120, the atomic ratio of the O atoms to the Al atoms may be $1.48 \leq y/x \leq 1.55$. The first passivation layer 120 may have a refractive index of 1.65~1.72, and a thickness of 4.4 nm~6.5 nm. In some examples, for the $Al_xO_y$ material of the first passivation layer 120, the atomic ratio of the O atoms to the Al atoms may be $4 \leq y/x \leq 7$. The first passivation layer 120 may have a refractive index of 1.6~1.65, and a thickness of 6.5 nm~8 nm.

The tunneling oxide layer 150 and the doped conductive layer 160 are formed on the back surface of the substrate 100 as a passivation contact structure, and the tunneling oxide layer 150 is used to achieve interface passivation on the back surface. In some examples, the material of the tunneling oxide layer 150 may be a dielectric material, such as silicon oxide. The doped conductive layer 160 is used to achieve field passivation. The doped conductive layer 160 and the substrate 100 are doped to have a same conductivity type. The doped conductive layer 160 and the substrate 100 may be doped with same dopants (or doping elements) or different dopants. In some examples, the doped conductive layer 160 may be at least one of an N-type doped polycrystalline silicon layer, an N-type doped microcrystalline silicon layer and an N-type doped amorphous silicon layer. The doped conductive layer 160 includes N-type dopants, such as at least one of phosphorus, arsenic or antimony.

In some examples, the doped conductive layer 160 is a doped polycrystalline silicon layer. The doped conductive layer 160 has a thickness of 60 nm~150 nm in the direction perpendicular to the back surface, such as 60 nm, 80 nm or 120 nm.

In some examples, the solar cell includes a fourth passivation layer 170, which is disposed on a side of the doped conductive layer 160 facing away from the substrate 100. The fourth passivation layer 170 includes a second $Si_mN_n$ material, and a value of n/m is $1.2 \leq y/x \leq 1.6$. The fourth passivation layer 170 is used to enhance the reflection effect of the incident light on the back of the solar cell, and further to enhance the passivation effect of the passivation contact structure on the back surface of the substrate 100. In the second $Si_mN_n$ material, n represents the number of N atoms and m represents the number of Si atoms. A refractive index and thickness of the fourth passivation layer 170 may be adjusted by adjusting the value of n/m. In some examples, the fourth passivation layer 170 has a single-layer structure. The fourth passivation layer 170 may have a refractive index of 1.9~2.1, and a thickness of 80 nm~100 nm. In some examples, the fourth passivation layer 170 may have a multi-layer structure. The refractive index of each sub-layer of the fourth passivation layer 170 gradually decreases in a direction from the back surface of the substrate 100 toward the doped conductive layer 160, so that it is beneficial to enhance the reflection effect of the incident light on a back of the solar cell by internal reflection.

The solar cell further includes a first electrode 180 and a second electrode 190. The first electrode 180 is disposed on the front surface of the substrate 100 and is electrically connected with the emitter 110 by penetrating through the third passivation layer 140, the second passivation layer 130 and the first passivation layer 120. The second electrode 190 is disposed on the back surface of the substrate 100 and is electrically connected with the doped conductive layer by penetrating through the fourth passivation layer 170.

In the above embodiments, the solar cell includes the first passivation layer 120, the second passivation layer 130 and the third passivation layer 140 sequentially formed on the front surface of the substrate 100 and in the direction away from the substrate 100. The first passivation layer 120 includes the dielectric material. The second passivation layer 130 includes the first $Si_uN_v$ material, and the value of v/u is $1.3 \leq v/u \leq 1.7$. The second passivation layer has relatively high refractive index by adjusting the atomic ratio in the first $Si_uN_v$ material, so that the second passivation layer can have relatively strong light absorption capacity for long-wave light. The third passivation layer 140 includes the $Si_rO_s$ material, and the value of s/r is $1.9 \leq s/r \leq 3.2$. The $Si_rO_s$ material can have relatively strong light absorption capacity for short-wave light by adjusting the atomic ratio in the $Si_rO_s$ material. In this way, the third passivation layer 140, together with the second passivation layer, allows the whole solar cell have relatively strong light absorption capacity for the incident light (including short-wave light and long-wave light), and thus the anti-reflectivity of the solar cell surface can be relatively large. Moreover, the first $Si_uN_v$ material and the $Si_rO_s$ material have a good passivation effect, thereby increasing improving the open-circuit voltage, the short-circuit current and the filling factor of the solar cell and improving the photoelectric conversion rate of the solar cell.

Figure 6:
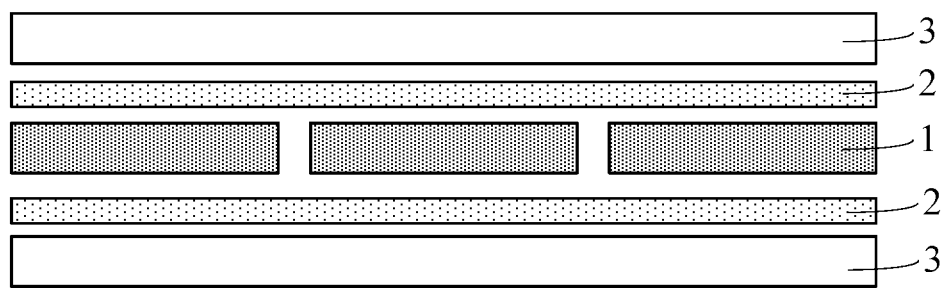
FIG. 6 shows a schematic structural diagram of a solar cell module according to some embodiments of the present disclosure.

Correspondingly, as shown in FIG. 6, some embodiments of the present disclosure further provide a solar cell module, including: at least one cell string formed by connecting a plurality of the solar cells 1 provided by the above embodiments; a packaging layer 2 configured to cover a surface of the at least one cell string; and a cover plate 3 configured to cover a surface of the packaging layer 2 away from the at least one cell string. The solar cells are electrically connected in a form of a whole piece or multiple pieces (for example, ½ equal pieces, ⅓ equal pieces, ¼ equal pieces and other multiple pieces) to form a plurality of cell strings, and the plurality of cell strings are electrically connected in series and/or parallel. In some examples, the plurality of cell strings may be electrically connected through conductive ribbons. The packaging layer 2 covers the front surface and the back surface of the solar cell. In some examples, the packaging layer 2 on the back surface of the solar cell may be white. In this way, in a case that incident light incident from the front surface of the solar cell is irradiated to the back of the solar cell from a gap between two adjacent solar cell, the incident light may be reflected to the cover plate 3 on the front surface of the solar cells through the white packaging layer 2, and then reflected to the front surface of the solar cell once again, thus increasing the light absorption capacity of the incident light. In some examples, the packaging layer 2 may be made of organic materials such as ethylene-vinyl acetate copolymer (EVA), polyolefin thermoplastic elastomer (POE) or polyethylene glycol terephthalate (PET). In some examples, the cover plate 3 may be a cover plate with a light-transmitting function, such as a glass cover plate, a plastic cover plate, and the like. A surface of the cover plate facing the packaging layer 2 may be a concave-convex surface, thereby increasing the utilization rate of the incident light. The solar cell of the present solar cell module includes a first passivation layer 120, a second passivation layer 130 and a third passivation layer 140 sequentially formed on the front surface. The second passivation layer 130 mainly absorbs long-wave light and the third passivation layer 140 mainly absorbs short-wave light, so that the solar cell has relatively strong light absorption capacity for incident light of different wave bands, thereby reducing a reflectivity of a front surface of a substrate 100 of the solar cell to light. Therefore, after the solar cells are packaged to form the solar cell module, the solar cell module is grayish blue or even black, which is beneficial for preparing a dark-colored solar cell module.

Correspondingly, some embodiments of the present disclosure further provide a method for preparing a solar cell, to prepare the solar cell provided in the above embodiments. The method will be described in detail with reference to the accompanying drawings.

FIGS. 7 to 13 show schematic structural diagrams corresponding to each step of the method for preparing the solar cell according to some embodiments of the present disclosure.

Figure 7:
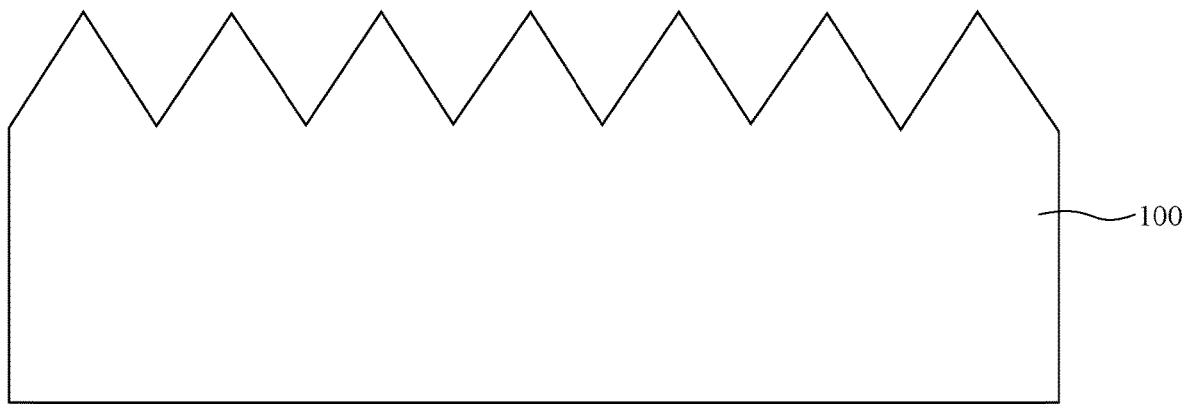
FIG. 7 to FIG. 12 show schematic structural diagrams corresponding to each step of a method for preparing a solar cell according to some embodiments of the present disclosure.

As shown in FIG. 7, a substrate 100 having a front surface and a back surface opposite to the front surface is provided.

The substrate 100 is used to receive incident light and generate photo-generated carriers. In some examples, the substrate 100 may be a silicon substrate 100, and the materials of the silicon substrate 100 may include at least one of monocrystalline silicon, polycrystalline silicon, amorphous silicon and microcrystalline silicon. In some examples, the material of the substrate 100 may be a carbon simple substance, an organic material or a multi-component compound. The multi-component compound includes gallium arsenide, cadmium telluride, copper indium selenium, etc. In some examples, the solar cell is a tunnel oxide passivated contact (TOPCON) solar cell, and both the front surface and back surface of the substrate 100 are used to receive the incident light. In some examples, the front surface of the substrate 100 may be set as a pyramid textured surface, so that a reflectivity of the front surface of the substrate 100 to the incident light is relatively small, and thus the light absorption and utilization rate of the front surface of the substrate 100 is relatively large. In some examples, the substrate 100 is an N-type semiconductor substrate, that is, the substrate 100 is doped with N-type dopants, and the N-type dopants may be any one of phosphorus, arsenic, or antimony.

Figure 8:
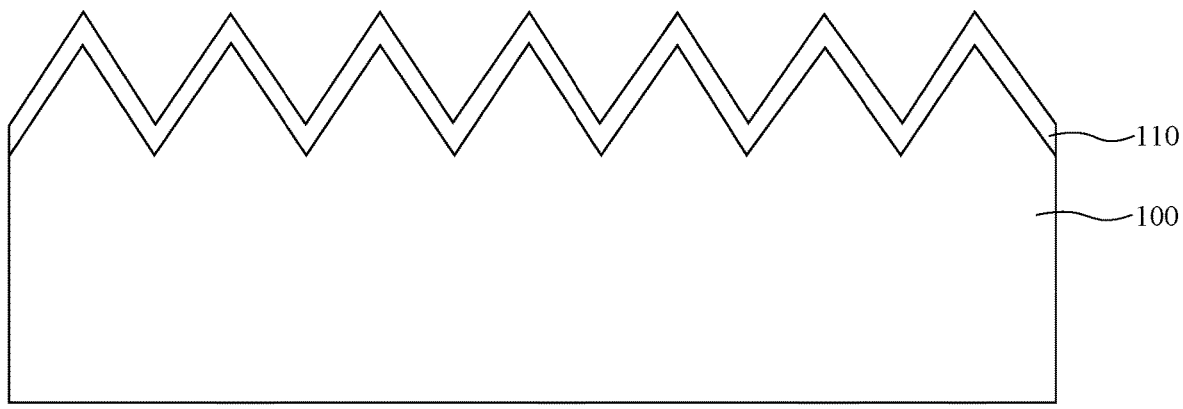

As shown in FIG. 8, an emitter 110 is formed.

In some examples, the substrate 100 is the N-type semiconductor substrate, and the emitter 110 is a P-type emitter. A specific process method for forming the emitter 110 may be as follows. The front surface of the substrate 100 is subjected to a boron diffusion treatment to form the emitter 110. The emitter 110 and the N-type substrate 100 form a PN junction. It is worth noting that after the emitter 110 is formed, borosilicate glass formed by the boron diffusion treatment is required to be removed, so that when a first passivation layer 120 is subsequently formed on the emitter 110, the first passivation layer 120 has a uniform thickness, which is beneficial to improving the light absorption capacity of the front surface of the substrate 100 to the incident light. In some examples, a boron source used in the boron diffusion treatment includes liquid boron tribromide.

Figure 9:
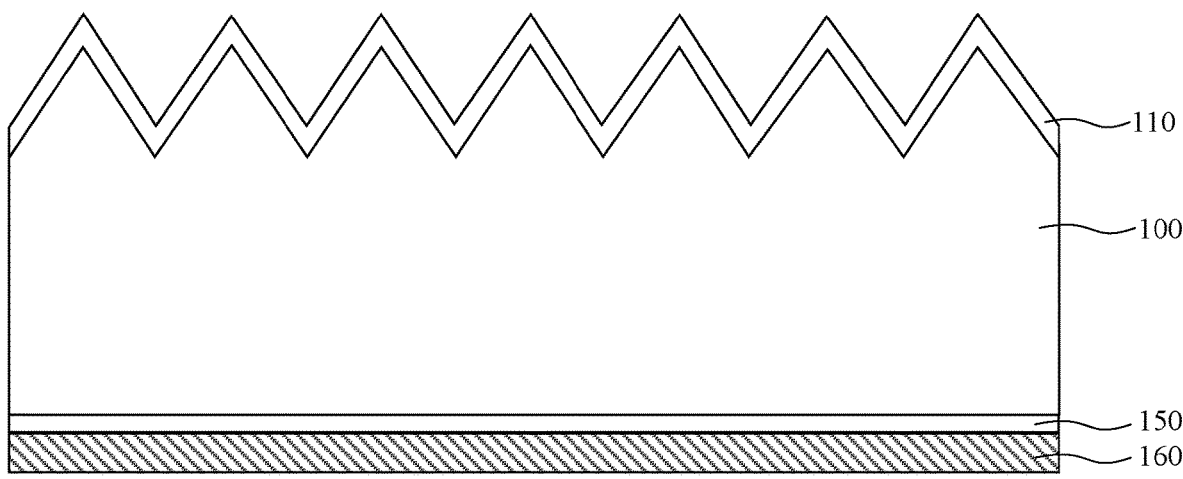

As shown in FIG. 9, a tunneling oxide layer 150 and a doped conductive layer 160 are sequentially formed on the back surface of a substrate 100 in a direction away from the back surface. The doped conductive layer 160 and the substrate 100 are doped to have a same conductivity type.

In some examples, the tunneling oxide layer 150 is deposited on the back surface of the substrate 100 by using a temperature-variable process and a chemical vapor deposition process. During the deposition, the heating rate is controlled to be 0.5° C./min~3° C./min, such as 1.0° C./min, 1.5° C./min, 2.0° C./min or 2.5° C./min, etc.; the deposition temperature is 560° C.~620° C., such as 570° C., 590° C. or 610° C., etc.; and the deposition time is 3 min~10 min, such as 4 min, 6 min or 8 min, etc. In some examples, the tunneling oxide layer 150 may be formed by an in-situ generation process, such as a thermal oxidation process or a nitric acid passivation process.

In some examples, the tunneling oxide layer 150 may have a thickness of 1 nm~2 nm, such as 1.2 nm, 1.4 nm, 1.6 nm or 1.8 nm.

In some examples, after forming the tunneling oxide layer 150, a deposition process may be adopted to form the doped conductive layer 160 on a surface of the tunneling oxide layer 150. The deposition process may be adopted to deposit intrinsic polycrystalline silicon on the surface of the tunneling oxide layer 150 to form a polycrystalline silicon layer. Then, phosphorus is doped to the polycrystalline silicon layer by an ion implantation and a source diffusion process to form an N-type doped polycrystalline silicon layer. The doped polycrystalline silicon layer serves as the doped conductive layer 160.

In some examples, the doped conductive layer 160 may have a thickness of 60 nm~150 nm, such as 60 nm, 80 nm or 120 nm, in a direction perpendicular to the back surface of the substrate 100.

As shown in FIGS. 10 to 13, the first passivation layer 120, a second passivation layer 130 and a third passivation layer 140 are sequentially formed on the front surface of a substrate 100 in a direction away from the substrate 100. The first passivation layer 120 includes a dielectric material. The second passivation layer 130 includes a first $Si_uN_v$ material, and a value of v/u is 1.3≤v/u≤1.7. The third passivation layer 140 includes a $Si_rO_s$ material, and a value of s/r is 1.9≤s/r≤3.2.

Figure 10:
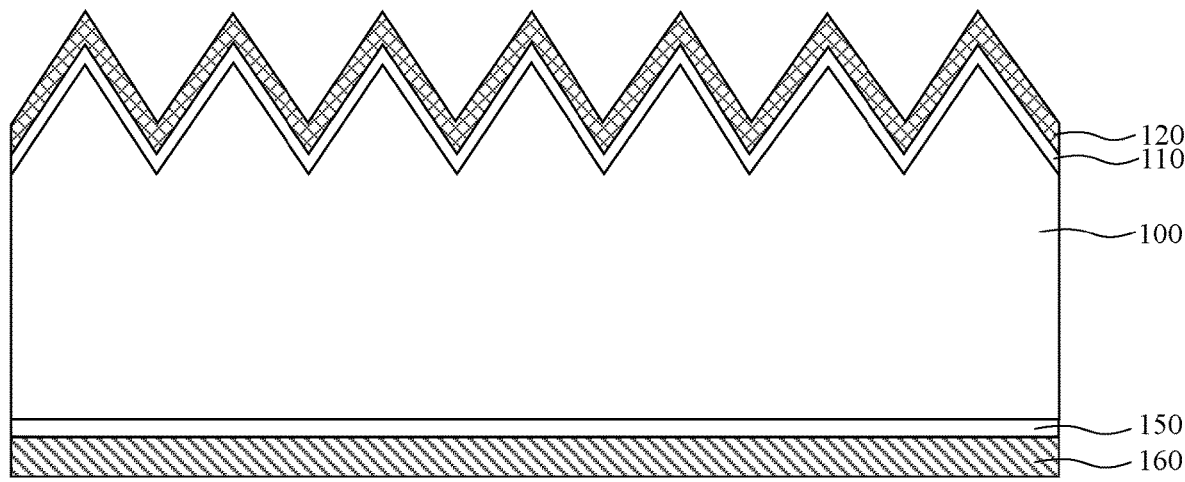

As shown in FIG. 10, the first passivation layer 120 is formed on the surface of the emitter 110. The first passivation layer 120 includes an $Al_xO_y$ material. In some examples, the first passivation layer 120 may be formed by an atomic layer deposition process. A method for forming the first passivation layer 120 includes introducing trimethyl aluminum and water into a reaction chamber, where a ratio of the trimethyl aluminum to the water is 1:2~1:3, and a temperature is 200° C.~300° C. In the first passivation layer 120, the atomic ratio of O atoms to Al atoms of the $Al_xO_y$ material is 1.4≤y/x≤1.6. The first passivation layer 120 has a refractive index of 1.6~1.8, and a thickness of 2 nm~8 nm.

In some examples, after the first passivation layer 120 is formed, the method further includes: performing an annealing process on the first passivation layer 120 in a nitrogen atmosphere, where an annealing temperature is 500° C.~600° C., and an annealing duration is 10 mim~13 min. In this way, residual water molecules and organic functional groups can be removed.

Figure 11:
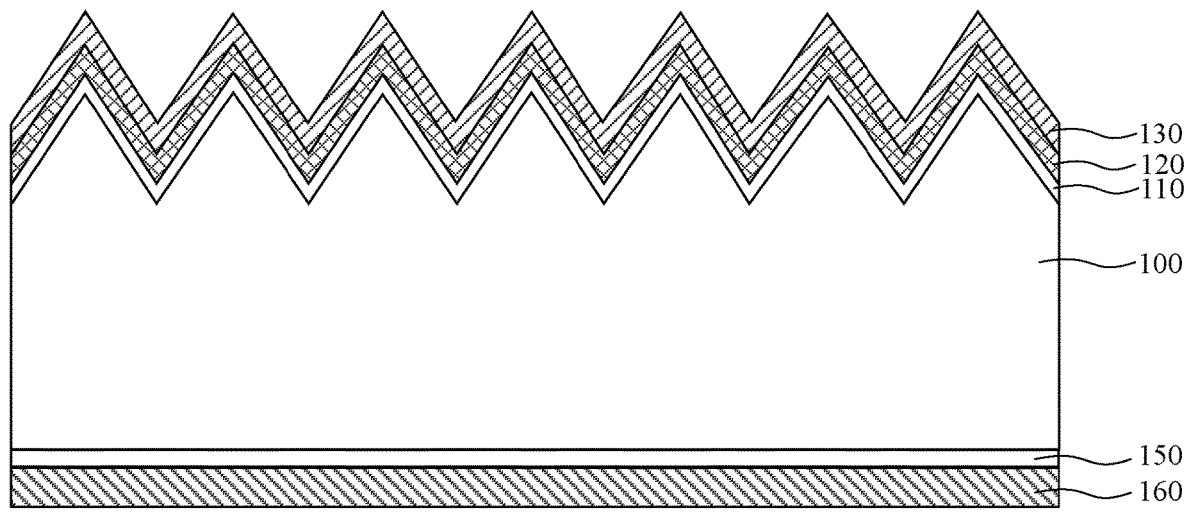

As shown in FIG. 11, the second passivation layer 130 is formed on a surface of the first passivation layer 120, and the second passivation layer 130 includes the first $Si_uN_v$ material. In some examples, the second passivation layer 130 may be formed by a plasma-enhanced chemical vapor deposition process. A method for forming the second passivation layer includes: introducing silane and ammonia gas into a reaction chamber and ionizing the silane and the ammonia gas. A pulse power per unit area is 140 mW/cm$^2$~180 mW/cm$^2$. A pressure of the reaction chamber is 1600 mTorr~2000 mTorr. A flow ratio of the silane to the ammonia gas is 1:3~1:16, and a reaction time is 3 s~31 s.

In some examples, the second passivation layer 130 may have a three-layer structure, and may include a first silicon nitride sub-layer 131 (refer to FIG. 4), a second silicon nitride sub-layer 132 (refer to FIG. 4), and a third silicon nitride sub-layer 133 (refer to FIG. 4) stacked in the direction away from the substrate 100. The process method for forming the second passivation layer 130 is as follows. The silane and the ammonia gas are introduced into a reaction chamber and ionized to form the first silicon nitride sub-layer 131 on the surface of the first passivation layer 120. The pulse power per unit area is 140 mW/cm$^2$~170 mW/cm$^2$. The pressure of the reaction chamber is 1600 mTorrr~2000 mTorr. The gas flow ratio of the silane to the ammonia gas may be 1:3~1:5, and the reaction time may be 4 s~6 s. The silane and the ammonia gas are continuously introduced into the reaction chamber and ionized to form the second silicon nitride sub-layer 132 on a surface of the first silicon nitride sub-layer 131. The pulse power per unit area is 150 mW/cm$^2$~180 mW/cm$^2$. The pressure of the reaction chamber is 1600 mTorrr~2000 mTorr. The gas flow ratio of the silane to the ammonia gas may be 1:5~1:9, and the reaction time may be 5 s~8 s. The silane and the ammonia gas are continuously introduced into the reaction chamber and ionized to form the third silicon nitride sub-layer 133 on a surface of the second silicon nitride sub-layer 132. The pulse power per unit area is 150 mW/cm$^2$~180 mW/cm$^2$. The pressure of the reaction chamber is 1600 mTorrr~2000 mTorr. The gas flow ratio of the silane to the ammonia gas may be 1:9~1:16, and the reaction time may be 10 s~14 s.

Based on the preparation process, an atomic ratio of N atoms to Si atoms in the first silicon nitride sub-layer 131 is 1.3≤s/r≤1.4. The first silicon nitride sub-layer 131 has a refractive index of 1.93~2.0, and a thickness of 8 nm~15 nm. The atomic ratio of the N atoms to the Si atoms in the second silicon nitride sub-layer 132 is 1.4≤s/r≤1.55. The second silicon nitride sub-layer 132 has a refractive index of 1.87~1.93, and a thickness of 10 nm~15 nm. The atomic ratio of the N atoms to the Si atoms in the third silicon nitride sub-layer 133 is 1.55≤s/r≤1.7. The third silicon nitride sub-layer 133 has a refractive index of 1.8~1.87, and a thickness of 17 nm~25 nm.

In some examples, the second passivation layer 130 may have a four-layer structure, including the first silicon nitride sub-layer 131, the second silicon nitride sub-layer 132, the third silicon nitride sub-layer 133 and a fourth silicon nitride sub-layer stacked in the direction away from the substrate 100. The process method for forming the second passivation layer 130 is as follows. The silane and the ammonia gas are introduced into the reaction chamber and ionized to form the first silicon nitride sub-layer 131 on the surface of the first passivation layer 120. The pulse power per unit area is 140 mW/cm$^2$~170 mW/cm$^2$. The pressure of the reaction chamber is 1600 mTorrr~2000 mTorr. The gas flow ratio of the silane to the ammonia gas may be 1:3~1:5, and the reaction time may be 3 s~5 s. The silane and the ammonia gas are continuously introduced into the reaction chamber and ionized to form the second silicon nitride sub-layer 132 on the surface of the first silicon nitride sub-layer 131. The pulse power per unit area is 150 mW/cm$^2$~180 mW/cm$^2$. The pressure of the reaction chamber is 1600 mTorrr~2000 mTorr. The gas flow ratio of the silane to the ammonia gas may be 1:5~1:7, and the reaction time may be 4 s~6 s. The silane and the ammonia gas are continuously introduced into the reaction chamber and ionized to form the third silicon nitride sub-layer 133 on the surface of the second silicon nitride sub-layer 132. The pulse power per unit area is 150 mW/cm$^2$~180 mW/cm$^2$. The pressure of the reaction chamber is 1600 mTorrr~2000 mTorr. The gas flow ratio of the silane to the ammonia gas may be 1:7~1:10, and the reaction time may be 4 s~6 s. The silane and the ammonia gas are continuously introduced into the reaction chamber and ionized to form the fourth silicon nitride sub-layer on a surface of the third silicon nitride sub-layer 133. The pulse power per unit area is 150 mW/cm$^2$~180 mW/cm$^2$. The pressure of the reaction chamber is 1600 mTorrr~2000 mTorr. The gas flow ratio of the silane to the ammonia gas may be 1:10~1:16, and the reaction time may be 10 s~14 s.

Figure 12:
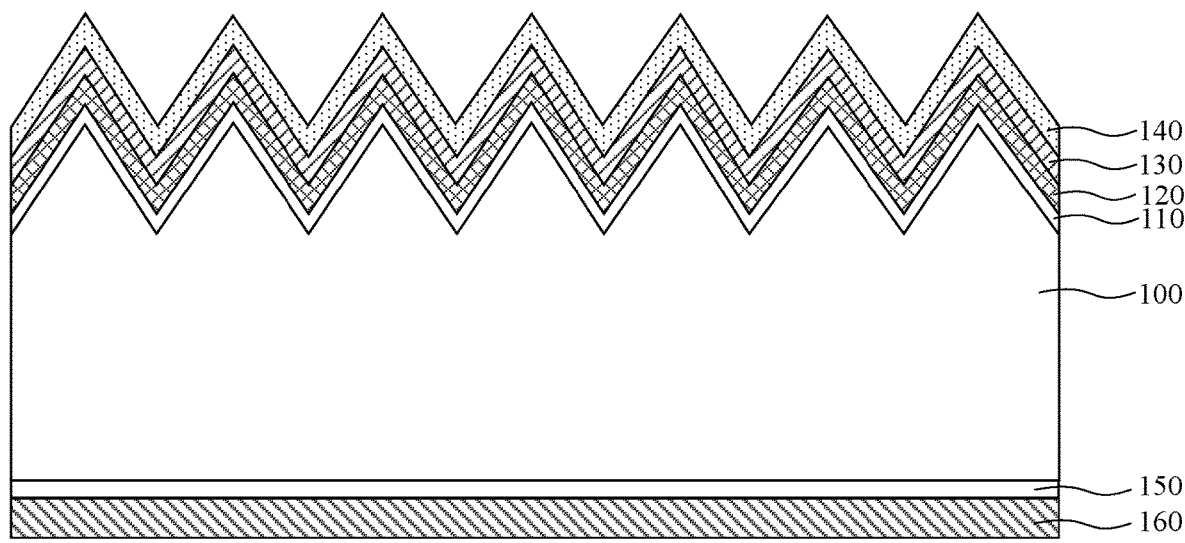

As shown in FIG. 12, the third passivation layer 140 is formed on the surface of the second passivation layer 130, and the third passivation layer 140 includes the $Si_rO_s$ material. In some examples, the third passivation layer 140 may be formed by the plasma-enhanced chemical vapor deposition process. A method for forming the third passivation layer 140 includes: introducing the silane and nitrous oxide into the reaction chamber and ionizing the silane and the nitrous oxide. The pulse power per unit area is 140 mW/cm$^2$~170 mW/cm$^2$. The pressure of the reaction chamber is 1600 mTorr~2000 mTorr. A flow ratio of the silane to the nitrous oxide is 1:15~1:20, and the reaction time is 3 s~22 s.

In some examples, the third passivation layer 140 may have a two-layer structure, and may include a first silicon oxide sub-layer 141 (refer to FIG. 2) and a second silicon oxide sub-layer 142 (refer to FIG. 2) stacked in the direction away from the substrate 100. The process method for forming the third passivation layer 140 is as follows. The silane and the nitrous oxide are introduced into the reaction chamber and ionized to form the first silicon oxide sub-layer 141 on the surface of the second passivation layer 130. The pulse power per unit area is 140 mW/cm$^2$~170 mW/cm$^2$. The pressure of the reaction chamber is 1600 mTorrr~2000 mTorr. The gas flow ratio of the silane to the nitrous oxide may be 1:15~1:17, and the reaction time may be 6 s~8 s. The silane and the nitrous oxide are continuously introduced into the reaction chamber and ionized to form the second silicon oxide sub-layer 142 on a surface of the first silicon oxide sub-layer 141. The pulse power per unit area is 140 mW/cm$^2$~170 mW/cm$^2$. The pressure of the reaction chamber is 1600 mTorrr~2000 mTorr. The gas flow ratio of the silane to the nitrous oxide may be 1:17~1:20, and the reaction time may be 6 s~10 s.

Based on the preparation process, an atomic ratio of O atoms to Si atoms in the first silicon oxide sub-layer 141 is 1.9≤s/r≤2.2. The first silicon oxide sub-layer 141 has a refractive index of 1.51~1.6, and a thickness of 30 nm~40 nm. The atomic ratio of the O atoms to the Si atoms in the second silicon oxide sub-layer 142 is 2.2≤s/r≤3.2. The second silicon oxide sub-layer 142 has a refractive index of 1.4~1.51, and a thickness of 30 nm~50 nm.

In some examples, the third passivation layer 140 may have a three-layer structure, and may include the first silicon oxide sub-layer 141 (refer to FIG. 3), the second silicon oxide sub-layer 142 (refer to FIG. 3), and a third silicon oxide sub-layer 143 (refer to FIG. 3) stacked in the direction away from the substrate 100. The process method for forming the third passivation layer 140 is as follows. The silane and the nitrous oxide are introduced into the reaction chamber and ionized to form the first silicon oxide sub-layer 141 on the surface of the second passivation layer 130. The pulse power per unit area is 140 mW/cm²~170 mW/cm². The pressure of the reaction chamber is 1600 mTorrr~2000 mTorr. The gas flow ratio of the silane to the nitrous oxide may be 1:15~1:16.5, and the reaction time may be 3 s~6 s. The silane and the nitrous oxide are continuously introduced into the reaction chamber and ionized to form the second silicon oxide sub-layer 142 on the surface of the first silicon oxide sub-layer 141. The pulse power per unit area is 140 mW/cm²~170 mW/cm². The pressure of the reaction chamber is 1600 mTorrr~2000 mTorr. The gas flow ratio of the silane to the nitrous oxide may be 1:16.5~1:18, and the reaction time may be 3 s~6 s. The silane and the nitrous oxide are continuously introduced into the reaction chamber and ionized to form the third silicon oxide sub-layer 143 on a surface of the second silicon oxide sub-layer 141. The pulse power per unit area is 140 mW/cm²~170 mW/cm². The pressure of the reaction chamber is 1600 mTorrr~2000 mTorr. The gas flow ratio of the silane to the nitrous oxide may be 1:18~1:20, and the reaction time may be 6 s~10 s.

Based on the preparation process, the atomic ratio of the O atoms to the Si atoms in the first silicon oxide sub-layer 141 is 1.9≤s/r≤2.2. The first silicon oxide sub-layer 141 has a refractive index of 1.51~1.6, and a thickness of 10 nm~20 nm. The atomic ratio of the O atoms to the Si atoms in the second silicon oxide sub-layer 142 is 2.2≤s/r≤2.7. The second silicon oxide sub-layer 142 has a refractive index of 1.45~1.51, and a thickness of 20 nm~30 nm. The atomic ratio of the O atoms to the Si atoms in the third silicon oxide sub-layer 143 is 2.7≤s/r≤3.2. The third silicon oxide sub-layer 143 has a refractive index of 1.4~1.45, and a thickness of 30 nm~40 nm.

As shown in FIG. 1, a fourth passivation layer 170 is formed on the doped conductive layer 160, and a first electrode 180 and a second electrode 190 are formed.

In some examples, the fourth passivation layer 170 includes a second $Si_mN_n$ material. The fourth passivation layer 170 may be formed on a surface of the doped conductive layer 160 by using the plasma-enhanced chemical vapor deposition process. In some examples, the fourth passivation layer 170 may have a single-layer structure. In some examples, the fourth passivation layer 170 may have a multi-layer structure, and the refractive index of each layer gradually decreases in a direction from the back surface of the substrate 100 toward the doped conductive layer 160.

After the fourth passivation layer 170 is formed, a metallization treatment is performed on the surfaces of the third passivation layer 140 on the front surface of the substrate 100 and the fourth passivation layer 170 on the back surface of the substrate 100. The metallization treatment includes a screen printing process and a high-temperature sintering process, so as to form the first electrode 180 electrically connected with the emitter 110 on the front surface of the substrate 100 and the second electrode 190 electrically connected with the doped conductive layer 160 on the back surface of the substrate 100. The first electrode 180 penetrates through the third passivation layer 140, the second passivation layer 130 and the first passivation layer 120 on the front surface of the substrate 100. The formed second electrode 190 penetrates through the fourth passivation layer 170.

In the above method for preparing the solar cell, the first passivation layer 120, the second passivation layer 130 and the third passivation layer 140 are formed sequentially on the front surface of the substrate 100 and in the direction away from the substrate 100. The first passivation layer 120 includes the dielectric material. The second passivation layer 130 includes the first $Si_uN_v$ material, and the value of v/u is 1.3≤v/u≤1.7. The second passivation layer has relatively high refractive index by adjusting the atomic ratio in the first $Si_uN_v$ material, so that the second passivation layer has relatively strong light absorption capacity for long-wave light. Besides, the first $Si_uN_v$ material in the second passivation layer 130 has good hydrogen passivation effect. The third passivation layer 140 includes the $Si_rO_s$ material, and the value of s/r is 1.9≤s/r≤3.2. The $Si_rO_s$ material can have relatively strong light absorption capacity for short-wave light by adjusting the atomic ratio in the $Si_rO_s$ material. In this way, the third passivation layer 140, together with the relatively strong light, allows the whole solar cell have relatively strong light absorption capacity for the incident light (including short-wave light and long-wave light), and thus the anti-reflectivity of the solar cell surface can be relatively large. Moreover, the first $Si_uN_v$ material and the $Si_rO_s$ material have a good passivation effect, thereby improving an open-circuit voltage, a short-circuit current and a filling factor of the solar cell and increasing the photoelectric conversion rate of the solar cell.

First Comparative Example

Figure 13:
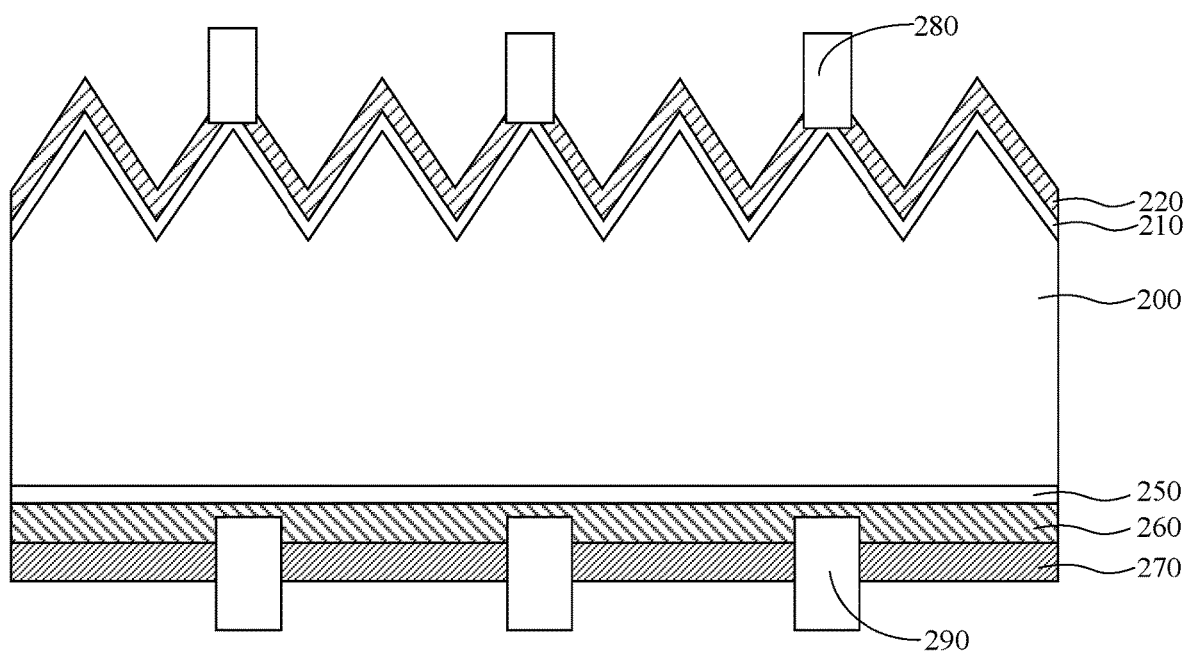
FIG. 13 shows a schematic structural diagram of a solar cell according to a first comparative example of the present disclosure.

The first comparative example provides a solar cell, as shown in FIG. 13, including: a substrate 200 having a front surface and a back surface opposite to the front surface; a front passivation layer 220 formed on a front surface of the substrate 200. The front passivation layer includes a $Si_aN_b$ material.

With reference to the structure of the solar cell according to some embodiments of the present disclosure shown in FIG. 1, the first comparative example differs from the embodiments of the present disclosure in that: a single-layered front passivation layer 220 is formed on the front surface of the substrate 200 in the first comparative example, and the material of the front passivation layer 220 is the $Si_aN_b$ material. In the embodiments of the present disclosure, the solar cell includes the first passivation layer 120, the second passivation layer 130 and the third passivation layer 140 sequentially formed on the front surface of the substrate 100 in the direction away from the substrate 100. Herein, the first passivation layer 120 includes the dielectric material, the second passivation layer 130 includes the first $Si_uN_v$ material, and the third passivation layer 140 includes the $Si_rO_s$ material. It is found through comparative experiments that the parameter comparison between the embodiments of the present disclosure and the first comparative example is shown in Table 1.

TABLE 1

|  | Reflectivity % | Open-circuit voltage mV | Short-circuit current A | Filling factor % | Conversion efficiency % |
|---|---|---|---|---|---|
| Embodiments of the present disclosure | 1.45 | 702 | 10.904 | 84.63 | 24.23 |

TABLE 1-continued

|  | Reflectivity % | Open-circuit voltage mV | Short-circuit current A | Filling factor % | Conversion efficiency % |
|---|---|---|---|---|---|
| First comparative example | 2.07 | 685 | 10.760 | 84.73 | 23.35 |

It can be seen from Table 1 that, compared with the first comparative example, the solar cell in the embodiments of the present disclosure has relatively lower reflectivity to incident light, and has relatively larger open-circuit voltage, short-circuit current and parallel resistance, so that the solar cell in the embodiments of the present disclosure has higher conversion efficiency. Herein, the reflectivity of the solar cell to the incident light is 0.62% lower than the reflectivity of the solar cell in the first comparative example, and the conversion efficiency of the solar cell is 0.88% higher than the conversion efficiency of the solar cell in the first comparative example. This is because in the first comparative example, the front passivation layer 220 is the $Si_aN_b$ material and is in a single-layered structure. The $Si_aN_b$ material has a relatively high refractive index, which may bring certain light absorption loss and poor light absorption capacity for the incident light. In the embodiments of the present disclosure, the second passivation layer 130 is the first $Si_uN_v$ material, for mainly absorbing long-wave light, and the third passivation layer is the $Si_rO_s$ material, for mainly absorbing short-wave light, so that the solar cell has good light absorption capacity for the incident light in different wave bands, thus making the solar cell have relatively high utilization rate of the incident light, thereby increasing the carrier concentration on the front surface of the substrate 100 and improving the conversion efficiency of the solar cell.

Second Comparative Example

Figure 14:
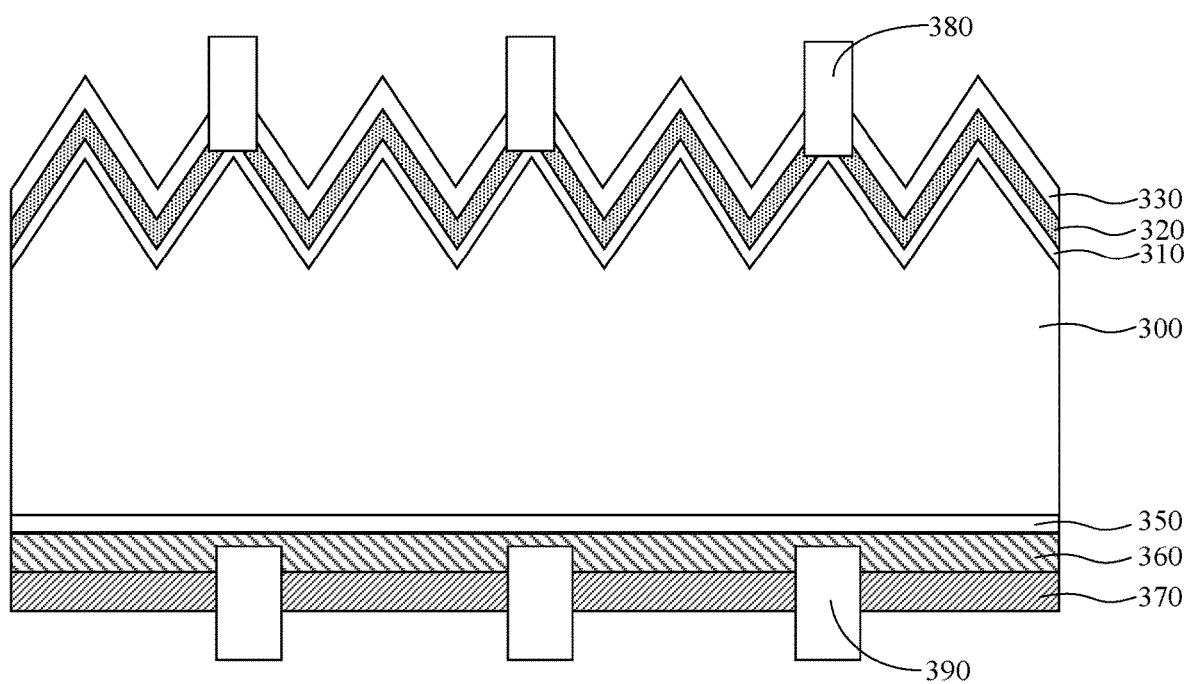
FIG. 14 shows a schematic structural diagram of a solar cell according to a second comparative example of the present disclosure.

The second comparative example provides a solar cell, as shown in FIG. 14, including: a substrate 300 having a front surface and a back surface opposite to the front surface; a first passivation layer 320 and a second passivation layer 330 sequentially formed on the front surface of the substrate 300 and in a direction away from the substrate 300. The first passivation layer 320 includes an $A_jO_k$ material, and the second passivation layer 330 includes a $Si_pN_q$ material.

With reference to the structure of the solar cell according to some embodiments of the present disclosure shown in FIG. 1, the second comparative example differs from the embodiments of the present disclosure in that: two passivation layers are formed on the front surface of the substrate 300 in the second comparative example. In the embodiments of the present disclosure, the solar cell includes the first passivation layer 120, the second passivation layer 130 and the third passivation layer 140 sequentially formed on the front surface of the substrate 100 in the direction away from the substrate 100. Herein, the first passivation layer 120 includes the dielectric material, the second passivation layer 130 includes the first $Si_uN_v$ material, and the third passivation layer 140 includes the $Si_rO_s$ material. It is found through comparative experiments that the parameter comparison between the embodiments of the present disclosure and the second comparative example is shown in Table 2.

TABLE 2

|  | Reflectivity % | Open-circuit voltage mV | Short-circuit current A | Filling factor % | Conversion efficiency % |
|---|---|---|---|---|---|
| Embodiments of the present disclosure | 1.45 | 702 | 10.904 | 84.63 | 24.23 |
| Second comparative example | 2.13 | 701 | 10.810 | 84.61 | 23.98 |

It can be can be seen from Table 2 that, compared with the second comparative example, the solar cell in the embodiments of the present disclosure has relatively lower reflectivity to incident light, and has relatively larger open-circuit voltage, short-circuit current, filling factor and parallel resistance, so that the solar cell in the embodiments of the present disclosure has higher conversion efficiency. Herein, the reflectivity of the solar cell to the incident light is 0.68% lower than the reflectivity of the solar cell in the second comparative example, and the conversion efficiency of the solar cell is 0.25% higher than the conversion efficiency of the solar cell in the second comparative example. This is because in the second comparative example, the second passivation layer 330 is the $Si_pN_q$ material, so the solar cell in the second comparative example may merely have good absorption effect on long-wave light. In the embodiments of the present disclosure, the third passivation layer is the $Si_rO_s$ material, for mainly absorbing short-wave light. The $Si_rO_s$ material of the third passivation layer, together with the first $Si_uN_v$ material of the second passivation layer 130, allows the solar cell have good light absorption capacity for the incident light in different wave bands. Further, in the embodiments of the present disclosure, the refractive index of the third passivation layer 140 is set to be lower than the refractive index of the second passivation layer 130, so that the incident light enters the optically denser medium from the optically thinner medium and enters the substrate 100 at a nearly vertical angle. Therefore, the utilization rate of the incident light is relatively high, thereby increasing the carrier concentration on the front surface of the substrate 100 and improving the conversion efficiency of the solar cell.

Although the present disclosure has been disclosed above in terms of preferred embodiments, the preferred embodiments are not intended to limit the claims. Any person skilled in the art may make some possible changes and modifications without departing from the concept of the present disclosure, so the protection scope of the present disclosure shall be subject to the scope defined by the claims.

Those skilled in the art shall appreciate that the aforementioned embodiments are specific embodiments for implementing the present disclosure. In practice, however, various changes may be made in the forms and details of the specific embodiments without departing from the scope of the present disclosure. Any person skilled in the art may make their own changes and modifications without departing from the scope of the present disclosure, so the protection scope of the present disclosure shall be subject to the scope defined by the claims.

What is claimed is:

1. A solar cell, comprising:
a substrate having a front surface and a back surface opposite to the front surface;
a first passivation layer formed over the front surface of the substrate, a second passivation layer formed over the first passivation layer, and a third passivation layer formed over the second passivation layer; wherein the first passivation layer includes a dielectric material; the second passivation layer includes a first $Si_uN_v$ material, wherein v/u is in the range of 1.3 to 1.7; and the third passivation layer includes a $Si_rO_s$ material, and wherein s/r is in the range of 1.9 to 3.2, wherein the third passivation layer includes a first silicon oxide sub-layer formed over the second passivation layer, a second silicon oxide sub-layer formed over the first silicon oxide sub-layer, and a third silicon oxide sub-layer formed over the second silicon oxide sub-layer, wherein in a direction perpendicular to the front surface, the first silicon oxide sub-layer has a thickness in a range of 10 nm to 20 nm, the second silicon oxide sub-layer has a thickness in a range of 20 nm to 30 nm, and the third silicon oxide sub-layer has a thickness in a range of 30 nm to 40 nm; and
a tunneling oxide layer formed over the back surface of the substrate and a doped conductive layer formed over the tunneling oxide layer.

2. The solar cell according to claim 1, wherein the dielectric material is an $Al_xO_y$ material.

3. The solar cell according to claim 2, wherein y/x is in the range of 1.4 to 1.6.

4. The solar cell according to claim 1, wherein the first silicon oxide sub-layer, the second silicon oxide sub-layer, and the third silicon oxide sub-layer each include the $Si_rO_s$ material, and refractive indices of the first silicon oxide sub-layer, the second silicon oxide sub-layer, and the third silicon oxide sub-layer gradually decrease.

5. The solar cell according to claim 4, wherein a value of s/r of the $Si_rO_s$ material of the first silicon oxide sub-layer is in a range of 1.9 to 2.2, a value of s/r of the $Si_rO_s$ material of the second silicon oxide sub-layer is in a range of 2.2 to 2.7, and a value of s/r of the $Si_rO_s$ material of the third silicon oxide sub-layer is in a range of 2.7 to 3.2.

6. The solar cell according to claim 1, wherein the second passivation layer includes a first silicon nitride sub-layer, a second silicon nitride sub-layer, and a third silicon nitride sub-layer stacked in the direction away from the substrate, wherein a value of v/u of the first $Si_uN_v$ material of the first silicon nitride sub-layer is in a range of 1.3 to 1.4, a value of v/u of the first $Si_uN_v$ material of the second silicon nitride sub-layer is in a range of 1.4 to 1.55, and a value of v/u of the first $Si_uN_v$ material of the third silicon nitride sub-layer is in a range of 1.55 to 1.7.

7. The solar cell according to claim 1, wherein the second passivation layer has a thickness in a range of 35 nm to 55 nm in a direction perpendicular to the front surface.

8. The solar cell according to claim 1, wherein the first passivation layer has a thickness in a range of 2 nm to 8 nm in a direction perpendicular to the front surface.

9. The solar cell according to claim 1, further comprising: a fourth passivation layer formed on a side of the doped conductive layer facing away from the substrate; wherein the fourth passivation layer includes a second $Si_mN_n$ material, and a value of n/m is in a range of 1.2 to 1.6.

10. The solar cell according to claim 9, wherein the fourth passivation layer has a refractive index in a range of 1.9 to 2.1, and the fourth passivation layer has a thickness in a range of 80 nm to 100 nm in a direction perpendicular to the back surface.

11. The solar cell according to claim 1, wherein the substrate is an N-type semiconductor substrate; the doped conductive layer is at least one of an N-type doped polycrystalline silicon layer, an N-type doped microcrystalline silicon layer and an N-type doped amorphous silicon layer.

12. A solar cell module, comprising:
at least one cell string formed by connecting a plurality of solar cells;
a packaging layer configured to cover a surface of the at least one cell string; and
a cover plate configured to cover a surface of the packaging layer away from the at least one cell string;
wherein each respective solar cell of the plurality of solar cells includes:
a substrate having a front surface and a back surface opposite to the front surface;
a first passivation layer formed over the front surface of the substrate, a second passivation layer formed over the first passivation layer, a third passivation layer formed over the second passivation layer; wherein the first passivation layer includes a dielectric material; the second passivation layer includes a first $Si_uN_v$ material, wherein v/u is in the range of 1.3 to 1.7; and the third passivation layer includes a $Si_rO_s$ material, wherein s/r is in the range of 1.9 to 3.2, wherein the third passivation layer includes a first silicon oxide sub-layer formed over the second passivation layer, a second silicon oxide sub-layer formed over the first silicon oxide sub-layer, and a third silicon oxide sub-layer formed over the second silicon oxide sub-layer, wherein in a direction perpendicular to the front surface, the first silicon oxide sub-layer has a thickness in a range of 10 nm to 20 nm, the second silicon oxide sub-layer has a thickness in a range of 20 nm to 30 nm, and the third silicon oxide sub-layer has a thickness in a range of 30 nm to 40 nm; and
a tunneling oxide layer formed over the back surface of the substrate and a doped conductive layer formed over the tunneling oxide layer.

13. The solar cell module according to claim 12, wherein the dielectric material is an $Al_xO_y$ material.

14. The solar cell module according to claim 13, wherein y/x is in the range of 1.4 to 1.6.

15. The solar cell module according to claim 12, wherein the first silicon oxide sub-layer, the second silicon oxide sub-layer, and the third silicon oxide sub-layer each include the $Si_rO_s$ material, and refractive indices of the first silicon oxide sub-layer, the second silicon oxide sub-layer, and the third silicon oxide sub-layer gradually decrease.

16. The solar cell module according to claim 15, wherein a value of s/r of the $Si_rO_s$ material of the first silicon oxide sub-layer is in a range of 1.9 to 2.2, a value of s/r of the $Si_rO_s$ material of the second silicon oxide sub-layer is in a range of 2.2 to 2.7, and a value of s/r of the $Si_rO_s$ material of the third silicon oxide sub-layer is in a range of 2.7 to 3.2.

17. The solar cell module according to claim 12, wherein the second passivation layer includes a first silicon nitride sub-layer, a second silicon nitride sub-layer, and a third silicon nitride sub-layer stacked in the direction away from the substrate, wherein a value of v/u of the first $Si_uN_v$ material of the first silicon nitride sub-layer is in a range of 1.3 to 1.4, a value of v/u of the first $Si_uN_v$ material of the second silicon nitride sub-layer is in a range of 1.4 to 1.55, and a value of v/u of the first $Si_uN_v$ material of the third silicon nitride sub-layer is in a range of 1.55 to 1.7.

18. The solar cell module according to claim 12, wherein the respective solar cell further comprises: a fourth passivation layer formed on a side of the doped conductive layer facing away from the substrate; wherein the fourth passivation layer includes a second $Si_mN_n$ material, and a value of n/m is in a range of 1.2 to 1.6.

* * * * *